(12) United States Patent
Schmaunz

(10) Patent No.: US 11,764,036 B2
(45) Date of Patent: Sep. 19, 2023

(54) OPERATING A GAS SUPPLY DEVICE FOR A PARTICLE BEAM DEVICE

(71) Applicant: Carl Zeiss Microscopy GmbH, Jena (DE)

(72) Inventor: Andreas Schmaunz, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 315 days.

(21) Appl. No.: 16/720,037

(22) Filed: Dec. 19, 2019

(65) Prior Publication Data

US 2020/0335309 A1   Oct. 22, 2020

(30) Foreign Application Priority Data

Dec. 20, 2018 (DE) .......................... 102018222522.2

(51) Int. Cl.
| | |
|---|---|
| *H01J 37/32* | (2006.01) |
| *H01J 37/145* | (2006.01) |
| *H01J 37/244* | (2006.01) |
| *H01J 37/28* | (2006.01) |
| *H01J 37/304* | (2006.01) |

(52) U.S. Cl.
CPC ...... *H01J 37/32449* (2013.01); *H01J 37/145* (2013.01); *H01J 37/244* (2013.01); *H01J 37/28* (2013.01); *H01J 37/304* (2013.01); *H01J 2237/006* (2013.01); *H01J 2237/2065* (2013.01)

(58) Field of Classification Search
CPC .... H01J 37/32449; H01J 37/304; H01J 37/28; H01J 37/244; H01J 27/02; H01J 2237/2065; H01J 2237/006; H01J 37/145; H01J 37/3178; H01J 37/02; H01J 37/26; H01J 2237/31749
USPC ................................................ 250/310, 309
See application file for complete search history.

(56) References Cited

U.S. PATENT DOCUMENTS

| | | |
|---|---|---|
| 2004/0036031 A1 | 2/2004 | Rose et al. |
| 2005/0103272 A1 | 5/2005 | Koops et al. |
| 2009/0121132 A1 | 5/2009 | Koops et al. |

(Continued)

FOREIGN PATENT DOCUMENTS

| | | |
|---|---|---|
| DE | 102 08 043 A1 | 9/2003 |
| DE | 103 38 019 A1 | 3/2005 |

(Continued)

*Primary Examiner* — Kiet T Nguyen
(74) *Attorney, Agent, or Firm* — Muirhead and Saturnelli, LLC

(57) ABSTRACT

A gas feed device is operated, including displaying a functional parameter of the gas feed device. A gas feed device may carry out the operation, and a particle beam apparatus may include the gas feed device. A method may include predetermining and/or measuring a current temperature of a precursor reservoir of the gas feed device using a temperature measuring unit, where the precursor reservoir contains a precursor to be fed onto an object, loading a flow rate of the precursor through an outlet of the precursor reservoir from a database into a control unit, said flow rate being associated with the current temperature of the precursor reservoir, and (i) displaying the flow rate on the display unit and/or (ii) determining the functional parameter of the precursor reservoir depending on the flow rate using the control unit and informing a user of the gas feed device about the determined functional parameter.

15 Claims, 8 Drawing Sheets

(56) References Cited

U.S. PATENT DOCUMENTS

| | | |
|---|---|---|
| 2016/0118216 A1 | 4/2016 | Doemer et al. |
| 2018/0015510 A1* | 1/2018 | Dobashi .............. H01J 37/3266 |
| 2018/0277361 A1* | 9/2018 | Routh, Jr. ......... H01L 21/02362 |
| 2018/0277391 A1* | 9/2018 | Moder ................ H01L 29/0661 |
| 2021/0216088 A1* | 7/2021 | Sawachi ............. H01J 37/3244 |

FOREIGN PATENT DOCUMENTS

| | | |
|---|---|---|
| DE | 10 2014 220 122 A1 | 4/2016 |
| EP | 1 892 748 B1 | 10/2011 |
| WO | WO 2002/067286 A2 | 8/2002 |

* cited by examiner

OPERATING A GAS SUPPLY DEVICE FOR A PARTICLE BEAM DEVICE

CROSS-REFERENCE TO RELATED APPLICATION

This application claims the priority of the German patent application No. 10 2018 222 522.2, filed on Dec. 20, 2018, which is hereby incorporated by reference.

TECHNICAL FIELD

The system described herein relates to a method for operating a gas feed device, in which at least one functional parameter of the gas feed device is displayed on a display device. Further, the system described herein relates to a gas feed device for carrying out the method, and a particle beam apparatus comprising a gas feed device.

BACKGROUND OF THE INVENTION

Electron beam apparatuses, in particular a scanning electron microscope (also referred to as SEM below) and/or a transmission electron microscope (also referred to as TEM below), are used to examine objects (samples) in order to obtain knowledge in respect of the properties and behavior under certain conditions.

In an SEM, an electron beam (also referred to as primary electron beam below) is generated by means of a beam generator and focused onto an object to be examined by way of a beam guiding system. The primary electron beam is guided in a raster manner over a surface of the object to be examined by way of a deflection device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An imaging of the object to be examined is thus obtained.

In the case of a TEM, a primary electron beam is likewise generated by means of a beam generator and focused onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging may also take place in the scanning mode of a TEM. As a rule, such a TEM is referred to as STEM. Additionally, provision can be made for detecting electrons backscattered at the object to be examined and/or secondary electrons emitted by the object to be examined by means of a further detector in order to image an object to be examfined.

Furthermore, it is known from the prior art to use combination apparatuses for examining objects, wherein both electrons and ions can be guided onto an object to be examined. By way of example, it is known to equip an SEM additionally with an ion beam column. An ion beam generator disposed in the ion beam column generates ions that are used for preparing an object (for example ablating material of the object or applying material to the object) or else for imaging. The SEM serves here in particular for observing the preparation, but also for further examination of the prepared or unprepared object.

In a further known particle beam apparatus, applying material to the object is carried out for example using the feed of a gas. The known particle beam apparatus is a combination apparatus that provides both an electron beam and an ion beam. The particle beam apparatus may comprise an electron beam column and an ion beam column. The electron beam column provides an electron beam that is focused onto an object. The object is disposed in a sample chamber kept under vacuum. The ion beam column provides an ion beam that is likewise focused onto the object. By way of example, a layer of the surface of the object is ablated by means of the ion beam. After said layer has been ablated, a further surface of the object is exposed. By means of a gas feed device, a gaseous precursor substance—a so-called precursor—can be admitted into the sample chamber. It is known to embody the gas feed device with an acicular device, which can be arranged very close to a position of the object at a distance of a few μm, such that the gaseous precursor substance can be guided to this position as accurately as possible and with a high concentration. As a result of the interaction of the ion beam with the gaseous precursor substance, a layer of a substance is deposited on the surface of the object. By way of example, it is known for gaseous phenanthrene to be admitted as gaseous precursor substance into the sample chamber by means of the gas feed device. Essentially a layer of carbon or a carbon-containing layer then deposits on the surface of the object. It is also known to use a gaseous precursor substance comprising metal in order to deposit a metal or a metal-containing layer on the surface of the object. However, the depositions are not limited to carbon and/or metals. Rather, arbitrary substances can be deposited on the surface of the object, for example semiconductors, non-conductors or other compounds. Furthermore, it is moreover known for the gaseous precursor substance to be used for ablating material of the object upon interaction with a particle beam.

The prior art has disclosed gas feed devices that comprise at least one gas reservoir or a plurality of gas reservoirs, wherein a precursor is received in each gas reservoir. An aforementioned gas reservoir is also referred to as precursor reservoir below. The precursor reservoir has a certain initial fill, namely an initial fill amount. Expressed differently, in the filled state, the precursor reservoir contains a certain amount of precursor which, in principle, is a mass and therefore also is referred to as initial fill mass. A precursor selected for a certain process—e.g., ablating or applying material from/to the object—is let out through an outlet of the precursor reservoir and guided to the object. Thus, depending on requirements, the precursor is let out through the outlet of the precursor reservoir until the initial fill—i.e., the initial fill amount—of the precursor in the precursor reservoir has been completely used up. The respective precursor reservoir is replaced once the precursor has been used up.

By way of example, the precursor is received as a solid or liquid pure substance in a known precursor reservoir. In order to bring the precursor into the gaseous phase, the precursor is evaporated within the precursor reservoir (transition from the liquid pure substance into the gaseous phase) or sublimated (direct transition from the solid pure substance into the gaseous phase). Subsequently, the gaseous precursor is guided by at least one capillary with a needle onto the object such that it can interact with the particle beam.

The flow rate of the precursor through the capillary and the needle is determined by the vapor pressure of the precursor, with the vapor pressure depending on the temperature of the precursor reservoir. Different concentrations of the precursor are guided to the surface of the object depending on the desired process on the surface of the object. The flow rate of the precursor through the capillary and the needle is altered in order to provide the different concentrations. The change in the flow rate of the precursor is achieved by changing the temperature of the precursor reservoir.

In order to ensure a smooth operation when processing an object with the precursor, it is desirable to know the approximate remaining time, during which the precursor can still emerge through the outlet of the precursor reservoir until the initial fill of the precursor reservoir has been completely used up. To this end, the practice of tracking the open duration of a valve at the outlet of the precursor reservoir is known. The precursor can emerge from the outlet of the precursor reservoir within the open duration. The tracked open durations are added to form a sum. The sum of the tracked open times is subtracted from an empirical value in respect of a service life of a comparable precursor reservoir at approximately the same temperature of the precursor reservoir, wherein a service life is a period of time during which an initial fill of the precursor reservoir is completely used up. The approximate remaining time is obtained as a result of the subtraction.

However, the aforementioned procedure is greatly afflicted by errors, and so a correct determination of the remaining time is only possible with difficulties. Errors of more than 50% in the aforementioned determination of the remaining time are not uncommon.

It is therefore desirable to be able to ascertain as accurately as possible the remaining time of a precursor reservoir and further functional parameters of the precursor reservoir, in particular the current fill amount and the current consumption.

SUMMARY OF THE INVENTION

Described herein is a system for ascertaining well at least one functional parameter of the precursor reservoir by means of any of: a method for operating a gas feed device, a gas feed device for carrying out the method and a particle beam apparatus comprising such a gas feed device.

A method according to the system described herein serves to operate a gas feed device, in which at least one functional parameter of the gas feed device is displayed on a display device, for example. The gas feed device may be provided with at least one precursor reservoir, in which at least one precursor may be received. The precursor reservoir may have a certain initial fill in the form of an initial fill amount. Expressed differently, the precursor reservoir contains a certain amount of precursor in the fully filled state, namely the initial fill. Expressed differently yet again, in the fully filled state, the precursor reservoir contains a certain amount of precursor which, in principle, may be a mass and therefore also may be referred to as initial fill mass. For processing the object—e.g., ablating or applying material from/to the object —, the precursor may be let out through an outlet of the precursor reservoir and guided to the object.

An embodiment of the method according to the system described herein comprises predetermining and/or measuring a current temperature of the precursor reservoir of the gas feed device using a temperature measuring unit. By way of example, an infrared measuring apparatus or a semiconductor temperature sensor may be used as temperature measuring unit. However, the system described herein is not restricted to the use of such temperature measuring units. Rather, any suitable temperature measuring unit which is suitable for the system described herein may be used as temperature measuring unit.

Furthermore, a further step of an embodiment of the method according to the system described herein involves loading a flow rate of the precursor through an outlet of the precursor reservoir from a database into a control unit. The flow rate may be associated with the current temperature of the precursor reservoir. Expressed differently, the flow rate of the precursor existing at the outlet of the precursor reservoir at the current temperature of the precursor reservoir may be loaded from the database.

Moreover, an embodiment of the method according to the system described herein provides for the flow rate loaded into the control unit to be displayed on the display unit of the to gas feed device or of a particle beam apparatus. In addition or as an alternative thereto, provision is made for at least one functional parameter of the precursor reservoir to be determined by means of the control unit depending on the flow rate of the precursor and, subsequently, for a user of the gas feed device to be informed about the determined functional parameter. By way of example, the determined functional parameter is displayed on the display unit of the gas feed device or of a particle beam apparatus. In addition or as an alternative thereto, an optical signal, for example a light signal, is output at an optical signaling device and/or an acoustic signal, for example a sound, is output at an acoustic signaling device. By way of example, the functional parameter is the current fill amount of the precursor reservoir or the remaining time, during which the precursor emerges through the outlet of the precursor reservoir until the initial fill (i.e., the initial fill mass) of the precursor reservoir is completely used up. Moreover, the flow rate also may be a functional parameter of the precursor reservoir.

A further method according to the system described herein likewise serves to operate a gas feed device, in which at least one functional parameter of the gas feed device may be displayed on a display device, for example. The gas feed device may be provided with at least one precursor reservoir, in which at least one precursor may be received. The precursor reservoir may have a certain initial fill in the form of an initial fill amount. Expressed differently, the precursor reservoir contains a certain amount of precursor in the fully filled state, namely the initial fill. Expressed differently yet again, in the fully filled state, the precursor reservoir contains a certain amount of precursor which, in principle, may be a mass and therefore also may be referred to as initial fill mass. For processing the object—e.g., ablating or applying material from/to the object —, the precursor may be let out through an outlet of the precursor reservoir and guided to the object.

The further method according to the system described herein comprises predetermining and/or measuring a current temperature of the precursor using a temperature measuring unit. By way of example, an infrared measuring apparatus or a semiconductor temperature sensor is used as temperature measuring unit. However, the system described herein is not restricted to the use of such temperature measuring units. Rather, any suitable temperature measuring unit which is suitable for the system described herein may be used as temperature measuring unit.

Furthermore, a further step of the further method according to the system described herein involves loading a flow rate of the precursor through an outlet of the precursor reservoir from a database into a control unit. The flow rate may be associated with the current temperature of the precursor. Expressed differently, the flow rate of the precursor existing at the outlet of the precursor reservoir at the current temperature of the precursor may be loaded from the database.

Moreover, the further method according to the system described herein provides for the flow rate loaded into the control unit to be displayed on the display unit of the gas feed device or of a particle beam apparatus. In addition or as an alternative thereto, provision is made for at least one functional parameter of the precursor reservoir to be determined by means of the control unit depending on the flow rate of the precursor and, subsequently, for a user of the gas feed device to be informed about the determined functional parameter. By way of example, the determined functional parameter is displayed on the display unit of the gas feed device or of the particle beam apparatus. In addition or as an alternative thereto, an optical signal, for example a light signal, is output at an optical signaling device and/or an acoustic signal, for example a sound, is output at an acoustic signaling device. By way of example, the functional parameter is the current fill amount of the precursor reservoir or the remaining time, during which the precursor emerges through the outlet of the precursor reservoir until the initial fill amount (i.e., the initial fill mass) of the precursor reservoir is completely used up. Moreover, the flow rate also may be a functional parameter of the precursor reservoir.

An advantage of the system described herein may be that the flow rate and/or a further functional parameter may be ascertainable in such a way that the flow rate and/or the further functional parameter may be specified as accurately as possible. By way of example, this ensures a smooth operation when processing an object with the precursor. In particular, this may ensure that a virtually empty precursor reservoir may be replaced in good time such that a substantially continuous flow of the precursor to the object may be possible.

A yet further method according to the system described herein likewise serves to operate a gas feed device, in which at least one functional parameter of the gas feed device may be displayed on a display device. The gas feed device may be provided with at least one precursor reservoir, in which at least one precursor may be received. The precursor reservoir may have a certain initial fill in the form of an initial fill amount. Expressed differently, the precursor reservoir contains a certain amount of precursor in the fully filled state, namely the initial fill. Expressed differently yet again, in the fully filled state, the precursor reservoir contains a certain amount of precursor which, in principle, may be a mass and therefore also may be referred to as initial fill mass. For processing the object—e.g., ablating or applying material from/to the object —, the precursor may be let out through an outlet of the precursor reservoir and guided to the object.

The yet further method according to the system described herein comprises predetermining a flow rate of the precursor through an outlet of the precursor reservoir. Furthermore, a further step of the yet further method according to the system described herein involves loading a temperature associated with the predetermined flow rate from a database into a control unit. Moreover, a temperature of the precursor reservoir may be set using a temperature setting unit to the temperature loaded from the database. By way of example, a heating and/or cooling device with a heating wire is used as a temperature setting unit. However, the system described herein is not restricted to the use of such a temperature setting unit. Rather, any temperature setting unit which is suitable for the system described herein may be used as temperature setting unit.

Moreover, provision may be made in the yet further method according to the system described herein for at least one functional parameter of the precursor reservoir to be determined by means of the control unit depending on the flow rate of the precursor and the temperature loaded from the database. Subsequently, a user of the gas feed device may be informed about the determined functional parameter. By way of example, the determined functional parameter is displayed on the display unit of the gas feed device or of the particle beam apparatus. In addition or as an alternative thereto, an optical signal, for example a light signal, is output at an optical signaling device and/or an acoustic signal, for example a sound, is output at an acoustic signaling device. By way of example, the functional parameter is the current fill amount of the precursor reservoir or the remaining time, during which the precursor emerges through the outlet of the precursor reservoir until the initial fill amount (i.e., the initial fill mass) of the precursor reservoir is completely used up.

The yet further method according to the system described herein likewise has the advantage that a functional parameter is ascertainable in such a way that the functional parameter may be specified as accurately as possible. By way of example, this ensures a smooth operation when processing an object with the precursor. In particular, this may ensure that a virtually empty precursor reservoir is replaced in good time such that a substantially continuous flow of the precursor to the object is possible.

As already mentioned above, informing the user of the gas feed device about the determined functional parameter in one embodiment of the methods according to the system described herein comprises displaying the determined functional parameter on the display unit, outputting an optical signal using an optical signaling device, for example a red light of an LED, and/or outputting an acoustic signal using an acoustic signaling device, for example a beeping of an alarm horn.

As likewise already mentioned above, provision is additionally or alternatively made in one embodiment of the methods according to the system described herein for a first functional parameter of the precursor reservoir in the form of a current fill amount (i.e., the fill mass) of the precursor reservoir to be determined depending on the flow rate, the initial fill amount (i.e., the initial fill mass) of the precursor reservoir and the time the precursor reservoir outlet is open. The time the outlet is open may be the time during which the precursor may flow to the object through the outlet of the precursor reservoir. By way of example, the time the outlet is open is the time during which a valve at the outlet of the precursor reservoir is open and facilitates the flow of the precursor through the outlet. When the valve at the outlet is closed, no precursor flows to the object through the outlet of the precursor reservoir.

In particular, the current fill of the precursor reservoir may be determined as follows:

$$m = M - (F(T_{current}) \cdot t_{open}) \quad [1]$$

where m is the current fill in the form of a current fill mass of the precursor reservoir (i.e., the current fill amount), M is the initial fill in the form of an initial fill mass of the precursor reservoir (i.e., the initial fill amount), F($T_{current}$) is the flow rate of the precursor through the outlet of the precursor reservoir at the current and/or set temperature of the precursor reservoir, and $t_{open}$ is the time the outlet of the precursor reservoir is open.

By way of example, the current fill amount may be calculated in a processor of the control unit.

In a further embodiment of the methods according to the system described herein, provision is additionally or alternatively made for the first functional parameter in the form of the current fill amount of the precursor reservoir to be displayed on the display unit of the gas feed device. In addition or as an alternative thereto, the first functional parameter in the form of the current fill amount of the precursor reservoir is displayed on the display unit of a particle beam apparatus.

As already mentioned above, provision is additionally or alternatively made in a yet further embodiment of the methods according to the system described herein for a second functional parameter of the precursor reservoir in the form of the remaining time, during which the precursor emerges through the outlet of the precursor reservoir until the initial fill (i.e., the initial fill amount, expressed yet again differently: the initial fill mass) of the precursor reservoir has been completely used up, to be determined depending on the current fill (i.e., the current fill amount, expressed yet again differently: the current fill mass) and the flow rate of the precursor and displayed on the display unit of the gas feed device and/or a particle beam apparatus. In particular, the remaining time may be determined as follows:

$$t_{remain} = \frac{m}{F(T_{current})} \quad [2]$$

where $t_{remain}$ is the remaining time, m is the current fill in the form of the current fill amount (i.e., the current fill mass) of the precursor reservoir, and F($T_{current}$) is the flow rate of the precursor through the outlet of the precursor reservoir at the current and/or set temperature of the precursor reservoir.

As already mentioned above, provision is made in an embodiment of the method according to the system described herein for the flow rate of the precursor through an outlet of the precursor reservoir to be loaded from the database into the control unit. The flow rate may be associated with the current temperature of the precursor reservoir. Expressed differently, the flow rate of the precursor existing at the outlet of the precursor reservoir at the current temperature of the precursor reservoir may be loaded from the database. In one embodiment of the method according to the system described herein, provision is additionally or alternatively made for the flow rate of the precursor through the outlet of the precursor reservoir to be determined depending on the temperature of the precursor reservoir and to be stored in the database for the purpose of loading from the database into the control unit. By way of example, provision is made for the flow rate of the precursor through the outlet of the precursor reservoir to be determined as follows:

determining the initial fill (i.e., the initial fill amount) in the form of an initial fill mass of the precursor reservoir, which has the initial fill mass, using a measuring device. By way of example, the measuring device is a conventional set of industrial scales. Accordingly, the precursor reservoir is weighed, for example. However, the system described herein is not restricted to the use of such a measuring device. Rather, any suitable measuring device may be used for the system described herein. By way of example, the initial fill of the precursor reservoir is determined in the removed state of the precursor reservoir. Expressed differently, in one embodiment, the precursor reservoir is removed from the gas feed device for the purposes of determining the initial fill or initially not even installed in the gas feed device;

setting a temperature of the precursor reservoir to a predeterminable temperature using a temperature setting unit, for example a heating and/or cooling device. By way of example, the heating device is a conventional infrared heating device. However, the system described herein is not restricted to the use of such a heating device. Rather, any suitable heating device may be used for the system described herein;

opening the outlet of the precursor reservoir such that the precursor emerges from the precursor reservoir through the outlet of the precursor reservoir. By way of example, a valve of the precursor reservoir is opened;

allowing the precursor to emerge from the precursor reservoir during a predeterminable period of time. Expressed differently, the length of time in which the precursor emerges from the precursor reservoir may be set, namely during the predeterminable period of time. By way of example, this period of time is between 0.5 hours and 10 hours, for example 5 or 6 hours. However, the system described herein is not restricted to the use of the aforementioned periods of time. Rather, any suitable period of time may be used for the system described herein;

closing the outlet of the precursor reservoir such that no precursor emerges from the precursor reservoir through the outlet of the precursor reservoir. By way of example, the valve of the precursor reservoir is closed;

determining an end fill amount (i.e., the end fill mass) of the precursor reservoir using the measuring device. Expressed differently, the precursor reservoir may be weighed again in order to determine how much precursor is still contained in the precursor reservoir; and determining the flow rate of the precursor at the predeterminable temperature depending on the initial fill mass (i.e., the initial fill amount), the end fill mass (i.e., the end fill amount) and the predeterminable period of time. By way of example, the flow rate F emerges as follows as a function of the predeterminable temperature:

$$F(T) = \frac{\text{initial fill mass} - \text{end fill mass}}{\text{predeterminable period of time}}. \quad [3]$$

By way of example, the aforementioned steps are implemented within the gas feed device. As an alternative thereto, provision is made for the aforementioned steps to be carried out, at least in part, outside of the gas feed device.

In one embodiment of the methods according to the system described herein, provision is additionally or alternatively made for at least one of the following steps to be carried out:

inserting the precursor reservoir into the gas feed device. Expressed differently, the precursor reservoir may be installed and/or inserted into the gas feed device. Subsequently, the temperature of the precursor reservoir may be set;

removing the precursor reservoir from the gas feed device. Expressed differently, the precursor reservoir may be taken from the gas feed device. This may be followed by determining the end fill mass (i.e., the end fill amount) of the precursor reservoir;

storing the determined flow rate in the database as a function of the predeterminable temperature;

storing the predeterminable temperature as a function of the determined flow rate.

In a further embodiment of the methods according to the system described herein, provision is additionally or alternatively made for the aforementioned method steps to be carried out multiple times and for a plurality of flow rates to be determined for a plurality of different temperatures. Then, the flow rates may be stored, for example, in the database as a function of the respective corresponding temperature and/or the respective corresponding temperatures may be stored as a function of the determined flow rates in the database. Expressed differently, provision is additionally or alternatively made in this embodiment of the methods according to the system described herein for a first flow rate of the precursor through the outlet of the precursor reservoir to be determined at a first predeterminable temperature and for a second flow rate of the precursor through the outlet of the precursor reservoir to be determined at a second predeterminable temperature. Further, provision may be made for, e.g., a functional relationship in respect of the first flow rate and the second flow rate to be determined depending on the first predeterminable temperature and the second predeterminable temperature. In addition or as an alternative thereto, provision is made for a functional relationship of the first predeterminable temperature and the second predeterminable temperature to be determined depending on the first flow rate and the second flow rate. In one embodiment of the methods according to the system described herein, the functional relationship also may be determined on the basis of more than two flow rates depending on different temperatures of the precursor reservoir in each case or on the basis of more than two temperatures depending on the determined flow rates. In particular, provision may be made for a multiplicity of flow rates to be ascertained depending on respectively different temperatures of the precursor reservoir. The multiplicity contains, e.g., more than three flow rates, more than eight flow rates or more than ten flow rates depending on respectively different temperatures of the precursor reservoir.

The functional relationship may be a linear relationship or a nonlinear relationship. A step function may by all means also be comprised by the functional relationship or forms the functional relationship. By way of example, the functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, provision is made for the functional relationship to be determined by an extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the first value and the second value.

In a further embodiment of the methods according to the system described herein, provision is additionally or alternatively made for the aforementioned method steps for determining the flow rate(s) to be carried out for a plurality of precursors, which may be received in different precursor reservoirs.

The system described herein also relates to a computer program product comprising program code, which may be loaded or is loaded into a processor of a gas feed device and/or into a processor of a particle beam apparatus, wherein the program code, when executed in the processor, controls the gas feed device in such a way that a method having at least one of the aforementioned or following features or having a combination of at least two of the aforementioned or following features is carried out.

The system described herein also relates to a gas feed device, which comprises, e.g., at least one of the aforementioned or following features or a combination of at least two of the aforementioned or following features. In particular, the gas feed device according to the system described herein may be provided with at least one precursor reservoir, which may comprise at least one precursor and at least one outlet for the precursor for the purposes of feeding the precursor onto an object. Further, the gas feed device according to the system described herein may comprise at least one temperature measuring unit for measuring a current temperature of the precursor reservoir and/or of the precursor and/or at least one temperature setting unit for setting the temperature of the precursor reservoir, at least one database for storing flow rates of the precursor through an outlet of the precursor reservoir and/or for storing temperatures associated with the flow rates, a display unit and at least one control unit with a processor, into which a computer program product having at least one of the aforementioned or following features or having a combination of at least two of the aforementioned or following features is loaded. By way of example, the display unit, the control unit and/or the database of the gas feed device is/are embodied as a display unit, control unit and/or database of a particle beam apparatus, in particular of the particle beam apparatus explained in more detail further below. In this respect, the system described herein also relates to a system comprising such a gas feed device and comprising such a particle beam apparatus.

The system described herein further relates to a particle beam apparatus for analyzing, observing and/or processing an object. The particle beam apparatus according to the system described herein may comprise at least one beam generator for generating a particle beam comprising charged particles. The charged particles may be electrons or ions, for example. The particle beam apparatus may comprise at least one objective lens for focusing the particle beam onto the object. Further, the particle beam apparatus may comprise at least one detector for detecting interaction particles and/or interaction radiation which emerge/emerges from an interaction between the particle beam and the object when the particle beam is incident on the object. Further, the particle beam apparatus according to the system described herein may be provided with at least one gas feed device, which may comprise at least one of the aforementioned or following features or a combination of at least two of the aforementioned or following features. By way of example, the particle beam apparatus also comprises a display unit for displaying the flow rate of a precursor and/or a further functional parameter of the gas feed device, a control unit for calculating the functional parameter of the gas feed device and/or a database for storing the flow rates of the precursor through the outlet of the precursor reservoir and/or for storing temperatures of the precursor reservoir.

In a further embodiment of the particle beam apparatus according to the system described herein, the beam generator is embodied as a first beam generator and the particle beam is embodied as a first particle beam comprising first charged particles. Further, the objective lens may be embodied as a first objective lens for focusing the first particle beam onto the object. Moreover, the particle beam apparatus according to the system described herein may comprise at least one second beam generator for generating a second particle beam comprising second charged particles. Further, the particle beam apparatus according to the system described herein may comprise at least one second objective lens for focusing the second particle beam onto the object.

In particular, provision may be made for the particle beam apparatus to be embodied as an electron beam apparatus and/or as an ion beam apparatus.

BRIEF DESCRIPTION OF THE DRAWINGS

Further practical embodiments and advantages of the system described herein are described below in association with the drawings. In the figures.

DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein may be used in any particle beam apparatus, in particular in any electron beam apparatus and/or any ion beam apparatus.

Figure 1:
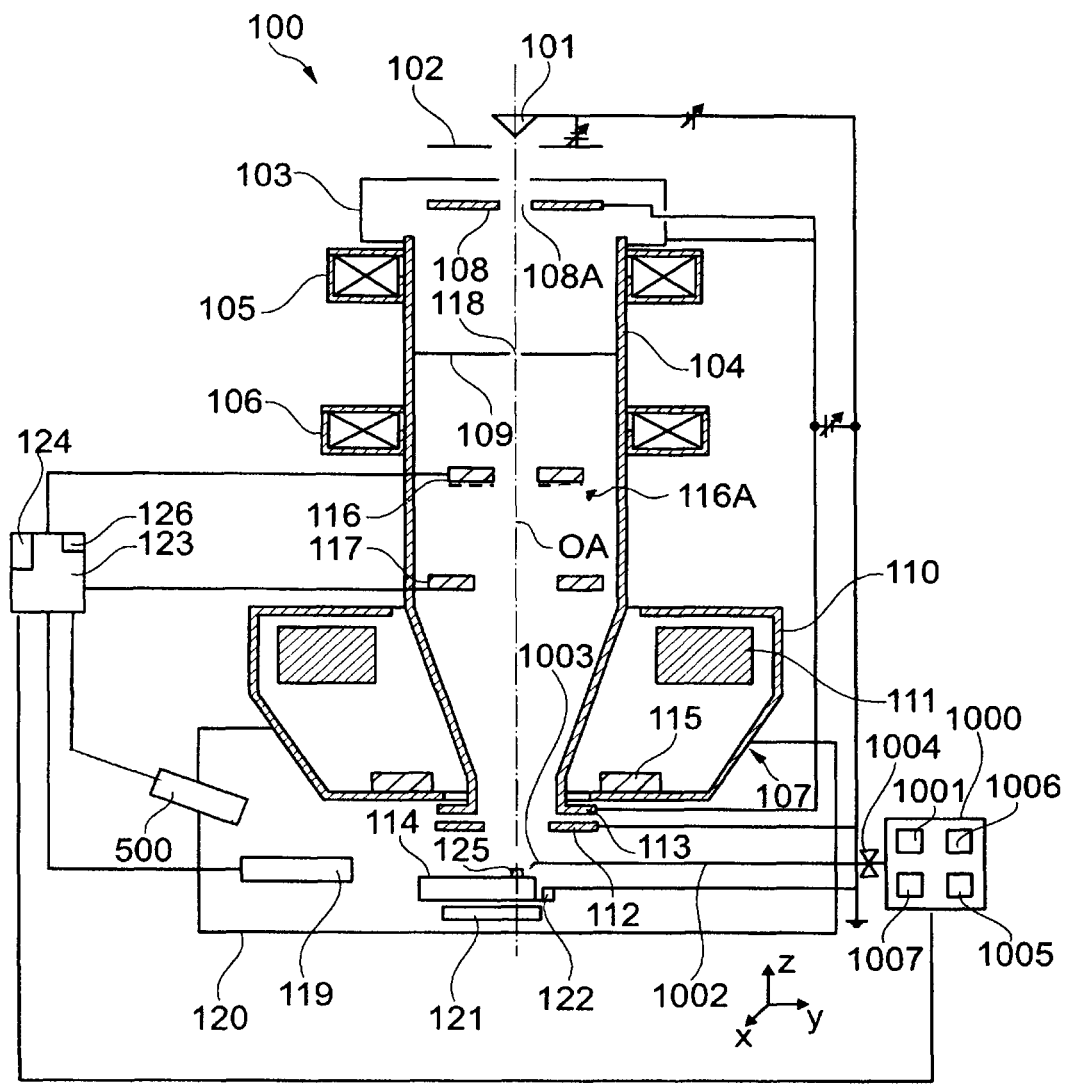
FIG. 1 shows a first embodiment of a particle beam apparatus.

FIG. 1 shows a schematic illustration of an SEM 100. The SEM 100 may comprise a first beam generator in the form of an electron source 101, which may be embodied as a cathode. Further, the SEM 100 may be provided with an extraction electrode 102 and with an anode 103, which may be placed onto one end of a beam guiding tube 104 of the SEM 100. By way of example, the electron source 101 is embodied as a thermal field emitter. However, the invention is not restricted to such an electron source 101. Rather, any electron source is utilizable.

Electrons emerging from the electron source 101 form a primary electron beam. The electrons may be accelerated to the anode potential on account of a potential difference between the electron source 101 and the anode 103. In the embodiment illustrated here, the anode potential may be 100 V to 35 kV, e.g. 5 kV to 15 kV, in particular 8 kV, relative to a ground potential of a housing of a sample chamber 120. However, alternatively it also may be at ground potential.

Two condenser lenses, namely a first condenser lens 105 and a second condenser lens 106, may be disposed at the beam guiding tube 104. Here, proceeding from the electron source 101 as viewed in the direction of a first objective lens 107, the first condenser lens 105 is disposed first, followed by the second condenser lens 106. Reference is explicitly made to the fact that further embodiments of the SEM 100 may have only a single condenser lens. A first aperture unit 108 may be disposed between the anode 103 and the first condenser lens 105. Together with the anode 103 and the beam guiding tube 104, the first aperture unit 108 may be at a high voltage potential, specifically the potential of the anode 103, or at ground. The first aperture unit 108 may have numerous first apertures 108A, of which one is illustrated in FIG. 1. Two first apertures 108A may be present, for example. Each one of the numerous first apertures 108A may have a different aperture diameter. By means of an adjustment mechanism (not illustrated), it is possible to set a desired first aperture 108A onto an optical axis OA of the SEM 100. Reference is explicitly made to the fact that, in further embodiments, the first aperture unit 108 may be provided with only a single aperture 108A. In this embodiment, an adjustment mechanism may be absent. The first aperture unit 108 then may be designed in a stationary fashion. A stationary second aperture unit 109 may be disposed between the first condenser lens 105 and the second condenser lens 106. As an alternative thereto, provision is made for the second aperture unit 109 to be embodied in a movable fashion.

The first objective lens 107 may have pole pieces 110, in which a hole may be formed. The beam guiding tube 104 may be guided through this hole. A coil 111 may be disposed in the pole pieces 110.

An electrostatic retardation device may be disposed in a lower region of the beam guiding tube 104. This may comprise an individual electrode 112 and a tube electrode 113. The tube electrode 113 may be disposed at one end of the beam guiding tube 104, said end facing an object 125 that may be disposed on an object holder 114 embodied in a movable fashion.

Together with the beam guiding tube 104, the tube electrode 113 may be at the potential of the anode 103, while the individual electrode 112 and the object 125 may be at a lower potential in relation to the potential of the anode 103. In the present case, this may be the ground potential of the housing of the sample chamber 120. In this manner, the electrons of the primary electron beam may be decelerated to a desired energy which is required for examining the object 125.

The SEM 100 further may comprise a scanning device 115, by means of which the primary electron beam may be deflected and scanned over the object 125. Here, the electrons of the primary electron beam interact with the object 125. As a result of the interaction, interaction particles arise, which may be detected. In particular, electrons may be emitted from the surface of the object 125—so-called secondary electrons—or electrons of the primary electron beam may be backscattered—so-called backscattered electrons—as interaction particles.

The object 125 and the individual electrode 112 may also be at different potentials and potentials different than ground. It is thereby possible to set the location of the retardation of the primary electron beam in relation to the object 125. By way of example, if the retardation is carried out quite close to the object 125, imaging aberrations become smaller.

A detector arrangement comprising a first detector 116 and a second detector 117 may be disposed in the beam guiding tube 104 for detecting the secondary electrons and/or the backscattered electrons. Here, the first detector 116 may be disposed on the source-side along the optical axis OA, while the second detector 117 may be disposed on the objectside along the optical axis OA in the beam guiding tube 104. The first detector 116 and the second detector 117 may be disposed offset from one another in the direction of the optical axis OA of the SEM 100. Both the first detector 116 and the second detector 117 each may have a passage opening, through which the primary electron beam may pass. The first detector 116 and the second detector 117 may be approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially may have a low kinetic energy and arbitrary directions of motion. By means of the strong extraction field emanating from the tube electrode 113, the secondary electrons may be accelerated in the direction of the first objective lens 107. The secondary electrons enter the first objective lens 107 approximately parallel. The beam diameter of the beam of the secondary electrons remains small in the first objective lens 107 as well. The first objective lens 107 then may have a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that may be backscattered at the object 125—that is to say backscattered electrons which may have a relatively high kinetic energy in comparison with the secondary electrons upon emerging from the object 125—may be detected by the second detector 117. The high kinetic energy and the angles of the backscattered electrons with respect to the optical axis OA upon emerging from the object 125 may have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grid 116A. The opposing field grid 116A may be disposed at the side of the first detector 116 directed toward the object 125. With respect to the potential of the beam guiding tube 104, the opposing field grid 116A may have a negative potential such that only backscattered electrons with a high energy pass through the opposing field grid 116A to the first detector 116. Additionally or alternatively, the second detector 117 has a further opposing field grid, which may have an analogous embodiment to the aforementioned opposing field grid 116A of the first detector 116 and which may have an analogous function.

Further, the SEM 100 may have in the sample chamber 120 a chamber detector 119, for example an Everhart-Thornley detector or an ion detector, which has a detection surface that is coated with metal and blocks light.

The detection signals generated by the first detector 116, the second detector 117 and the chamber detector 119 may be used to generate an image or images of the surface of the object 125.

Reference is explicitly made to the fact that the apertures of the first aperture unit 108 and of the second aperture unit 109, as well as the passage openings of the first detector 116 and of the second detector 117, are illustrated in exaggerated fashion. The passage openings of the first detector 116 and of the second detector 117 may have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 may be configured as a pinhole aperture unit in the embodiment illustrated here and may be provided with a second aperture 118 for the passage of the primary electron beam, which may have an extent in the range from 5 μm to 500 μm, e.g. 35 μm. As an alternative thereto, provision is made in a further embodiment for the second aperture unit 109 to be provided with a plurality of apertures, which may be displaced mechanically with respect to the primary electron beam or which may be reached by the primary electron beam by the use of electrical and/or magnetic deflection elements. The second aperture unit 109 may be embodied as a pressure stage aperture unit. This separates a first region, in which the electron source 101 may be disposed and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam guiding tube 104, which leads to the sample chamber 120.

The sample chamber 120 may be under vacuum. For the purposes of generating the vacuum, a pump (not illustrated) may be disposed at the sample chamber 120. In the embodiment illustrated in FIG. 1, the sample chamber 120 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 120 may be vacuum-sealed.

The object holder 114 may be disposed at a sample stage 122. The sample stage 122 may be embodied to be movable in three directions disposed perpendicular to one another, namely in an x-direction (first stage axis), in a y-direction (second stage axis) and in a z-direction (third stage axis). Moreover, the sample stage 122 may be rotated about two rotation axes which may be disposed perpendicular to one another (stage rotation axes). The system described herein is not restricted to the sample stage 122 described above. Rather, the sample stage 122 may have further translation axes and rotation axes along which or about which the sample stage 122 may move.

The SEM 100 further may comprise a third detector 121, which may be disposed in the sample chamber 120. More precisely, the third detector 121 may be disposed downstream of the sample stage 122, viewed from the electron source 101 along the optical axis OA. The sample stage 122, and hence the object holder 114, may be rotated in such a way that the primary electron beam may radiate through the object 125 disposed on the object holder 114. When the primary electron beam passes through the object 125 to be examined, the electrons of the primary electron beam interact with the material of the object 125 to be examined. The electrons passing through the object 125 to be examined may be detected by the third detector 121.

Disposed at the sample chamber 120 may be a radiation detector 500, which may be used to detect interaction radiation, for example x-ray radiation and/or cathodoluminescence. The radiation detector 500, the first detector 116, the second detector 117 and the chamber detector 119 may be connected to a control unit 123, which may have a monitor 124. In the embodiment illustrated here, the monitor 124 is provided with an additional optical signaling device, for example a red LED, and/or with an additional acoustic signaling device, which may emit a warning sound. The third detector 121 also may be connected to the control unit 123. This is not illustrated for reasons of clarity. The control unit 123 processes detection signals that may be generated by the first detector 116, the second detector 117, the chamber detector 119, the third detector 121 and/or the radiation detector 500 and displays said detection signals in the form of images on the monitor 124.

The control unit 123 furthermore may have a database 126, in which data may be stored and from which data may be read out.

The SEM 100 may comprise a gas feed device 1000, which serves to feed a gaseous precursor to a specific position on the surface of the object 125. The gas feed device 1000 may comprise a gas reservoir in the form of a precursor reservoir 1001. The precursor reservoir 1001 may have a certain initial fill. Expressed differently, the precursor reservoir contains a certain amount of precursor in the fully filled state. This also may be referred to as initial fill mass or initial fill amount, as already mentioned above. By way of example, the precursor is received as a solid or liquid pure substance in the precursor reservoir 1001. In order to bring the precursor into the gaseous phase, the precursor may be evaporated or sublimated within the precursor reservoir 1001. By way of example, phenanthrene is used as precursor. Essentially a layer of carbon or a carbon-containing layer then deposits on the surface of the object 125. As an alternative thereto, by way of example, a precursor comprising metal may be used to deposit a metal or a metal-containing layer on the surface of the object 125. However, the depositions are not limited to carbon and/or metals. Rather, arbitrary substances may be deposited on the surface of the object 125, for example semiconductors, non-conductors or other compounds. Furthermore, provision also may be made for the precursor to be used for ablating material of the object 125 upon interaction with the particle beam.

The gas feed device 1000 may be provided with a feed line 1002. The feed line 1002 may have, in the direction of the object 125, a hollow tube 1003, which may be able to be brought into the vicinity of the surface of the object 125 for example at a distance of 10 μm to 1 mm from the surface of the object 125. The hollow tube 1003 may have a feed opening, the diameter of which is, for example, in the range of 10 μm to 1000 μm, in particular in the range of 100 μm to 600 μm. The feed line 1002 may have a valve 1004 in order to regulate the flow rate of gaseous precursor into the feed line 1002. Expressed differently, when the valve 1004 is opened, gaseous precursor from the precursor reservoir 1001 may be introduced into the feed line 1002 and guided via the hollow tube 1003 to the surface of the object 125. When the valve 1004 is closed, the flow of the gaseous precursor onto the surface of the object 125 may be stopped.

The gas feed device 1000 may be furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the SEM 100.

In further embodiments, the precursor reservoir 1001 is not disposed directly at the gas feed device 1000. Rather, in said further embodiments, provision is made for the precursor reservoir 1001 to be disposed for example at a wall of a space in which the SEM 100 is situated.

The gas feed device 1000 may comprise a temperature measuring unit 1006. By way of example, an infrared measuring apparatus or a semiconductor temperature sensor is used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be disposed at the gas feed device 1000 itself, but rather to be disposed for example at a distance from the gas feed device 1000.

The gas feed device 1000 further may comprise a temperature setting unit 1007. By way of example, the temperature setting unit 1007 is a heating device, in particular a conventional infrared heating device. As an alternative thereto, the temperature setting unit 1007 is embodied as a heating and/or cooling device, which may comprise a heating wire, for example. However, the system described herein is not restricted to the use of such a temperature setting unit 1007. Rather, any suitable temperature setting unit may be used for the system described herein.

Figure 2:
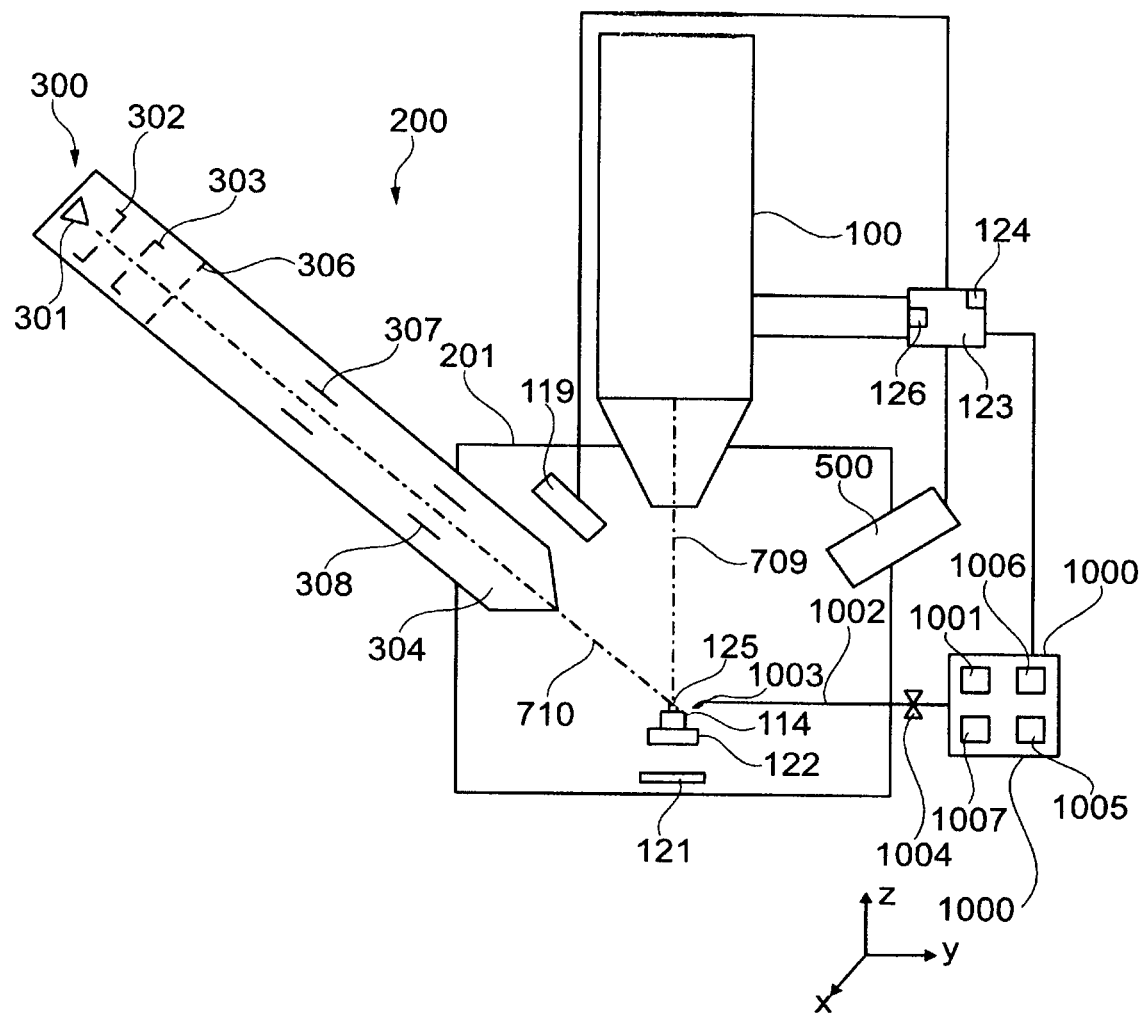
FIG. 2 shows a second embodiment of a particle beam apparatus.

FIG. 2 shows a particle beam apparatus in the form of a combination apparatus 200. The combination apparatus 200 may have two particle beam columns. Firstly, the combination apparatus 200 may be provided with the SEM 100, as already illustrated in FIG. 1, but without the sample chamber 120. Rather, the SEM 100 may be disposed at a sample chamber 201. The sample chamber 201 may be under vacuum. For the purposes of generating the vacuum, a pump (not illustrated) may be disposed at the sample chamber 201. In the embodiment illustrated in FIG. 2, the sample chamber 201 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 201 may be vacuum-sealed.

Disposed in the sample chamber 201 may be the chamber detector 119 which is embodied, for example, in the form of an Everhart-Thornley detector or an ion detector and which has a detection surface coated with metal that blocks light. Further, the third detector 121 may be disposed in the sample chamber 201.

The SEM 100 serves to generate a first particle beam, namely the primary electron beam already described further above, and has the optical axis, already specified above, which may be provided with the reference sign 709 in FIG. 2 and which is also referred to as first beam axis below. Secondly, the combination apparatus 200 may be provided with an ion beam apparatus 300, which may be likewise disposed at the sample chamber 201. The ion beam apparatus 300 likewise has an optical axis, which is provided with the reference sign 710 in FIG. 2 and which is also referred to as second beam axis below.

The SEM 100 may be disposed vertically in relation to the sample chamber 201. By contrast, the ion beam apparatus 300 may be disposed in a manner inclined by an angle of approximately 0° to 90° in relation to the SEM 100. An arrangement of approximately 50° is illustrated by way of example in FIG. 2. The ion beam apparatus 300 may comprise a second beam generator in the form of an ion beam generator 301. Ions, which form a second particle beam in the form of an ion beam, may be generated by the ion beam generator 301. The ions may be accelerated by means of an extraction electrode 302, which may be at a predeterminable potential. The second particle beam then passes through an ion optical unit of the ion beam apparatus 300, wherein the ion optical unit may comprise a condenser lens 303 and a second objective lens 304. The second objective lens 304 ultimately generates an ion probe, which may be focused onto the object 125 disposed at an object holder 114. The object holder 114 may be disposed at a sample stage 122.

A settable or selectable aperture unit 306, a first electrode arrangement 307 and a second electrode arrangement 308 may be disposed above the second objective lens 304 (i.e., in the direction of the ion beam generator 301), wherein the first electrode arrangement 307 and the second electrode arrangement 308 are embodied as scanning electrodes. The second particle beam may be scanned over the surface of the object 125 by means of the first electrode arrangement 307 and the second electrode arrangement 308, with the first electrode arrangement 307 acting in a first direction and the second electrode arrangement 308 acting in a second direction, which may be counter to the first direction. Thus, scanning may be carried out e.g. in an x-direction. The scanning in a y-direction perpendicular thereto may be brought about by further electrodes (not illustrated), which may be rotated by 90°, at the first electrode arrangement 307 and at the second electrode arrangement 308.

As explained above, the object holder 114 may be disposed at the sample stage 122. In the embodiment shown in FIG. 2, too, the sample stage 122 may be embodied to be movable in three directions disposed perpendicular to one another, namely in an x-direction (first stage axis), in a y-direction (second stage axis) and in a z-direction (third stage axis). Moreover, the sample stage 122 may be rotated about two rotation axes which may be disposed perpendicular to one another (stage rotation axes).

The distances illustrated in FIG. 2 between the individual units of the combination apparatus 200 are illustrated in exaggerated fashion in order to better illustrate the individual units of the combination apparatus 200.

Disposed at the sample chamber 201 may be a radiation detector 500, which may be used to detect interaction radiation, for example x-ray radiation and/or cathodoluminescence. The radiation detector 500 may be connected to a control unit 123, which may have a monitor 124. In the embodiment illustrated here, the monitor 124 may be provided with an additional optical signaling device, for example a red LED, and/or with an additional acoustic signaling device, which may emit a warning sound.

The control unit 123 processes detection signals that may be generated by the first detector 116, the second detector 117 (not illustrated in FIG. 2), the chamber detector 119, the third detector 121 and/or the radiation detector 500 and displays said detection signals in the form of images on the monitor 124.

The control unit 123 furthermore may have a database 126, in which data may be stored and from which data may be read out.

The combination apparatus 200 may comprise a gas feed device 1000, which serves to feed a gaseous precursor to a specific position on the surface of the object 125. The gas feed device 1000 may comprise a gas reservoir in the form of a precursor reservoir 1001.

The precursor reservoir 1001 may have a certain initial fill. Expressed differently, the precursor reservoir 1001 contains a certain amount of precursor in the fully filled state. This may be the initial fill mass. By way of example, the precursor is received as a solid or liquid pure substance in the precursor reservoir 1001. In order to bring the precursor into the gaseous phase, the precursor may be evaporated or sublimated within the precursor reservoir 1001.

By way of example, phenanthrene is used as precursor. Essentially a layer of carbon or a carbon-containing layer then deposits on the surface of the object 125. As an alternative thereto, by way of example, a precursor comprising metal may be used to deposit a metal or a metal-containing layer on the surface of the object 125. However, the depositions are not limited to carbon and/or metals. Rather, arbitrary substances may be deposited on the surface of the object 125, for example semiconductors, non-conductors or other compounds. Furthermore, provision also may be made for the precursor to be used for ablating material of the object 125 upon interaction with one of the two particle beams.

The gas feed device 1000 may be provided with a feed line 1002. The feed line 1002 may have, in the direction of the object 125, a hollow tube 1003, which may be able to be brought into the vicinity of the surface of the object 125 for example at a distance of 10 μm to 1 mm from the surface of the object 125. The hollow tube 1003 may have a feed opening, the diameter of which is, for example, in the range of 10 μm to 1000 μm, in particular in the range of 100 μm to 600 μm. The feed line 1002 may have a valve 1004 in order to regulate the flow rate of gaseous precursor into the feed line 1002. Expressed differently, when the valve 1004 is opened, gaseous precursor from the precursor reservoir 1001 may be introduced into the feed line 1002 and guided via the hollow tube 1003 to the surface of the object 125. When the valve 1004 is closed, the flow of the gaseous precursor onto the surface of the object 125 may be stopped.

The gas feed device 1000 may be furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the SEM 100.

In further embodiments, the precursor reservoir 1001 is not disposed directly at the gas feed device 1000. Rather, in said further embodiments, provision is made for the precursor reservoir 1001 to be disposed for example at a wall of a space in which the combination apparatus 200 is situated.

The gas feed device 1000 may comprise a temperature measuring unit 1006. By way of example, an infrared measuring apparatus or a semiconductor temperature sensor is used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be disposed at the gas feed device 1000 itself, but rather to be disposed for example at a distance from the gas feed device 1000.

The gas feed device 1000 further may comprise a temperature setting unit 1007. By way of example, the temperature setting unit 1007 is a heating device, in particular a conventional infrared heating device. As an alternative thereto, the temperature setting unit 1007 is embodied as a heating and/or cooling device, which may comprise a heating wire, for example. However, the system described herein is not restricted to the use of such a temperature setting unit 1007. Rather, any suitable temperature setting unit may be used for the system described herein.

Figure 3:
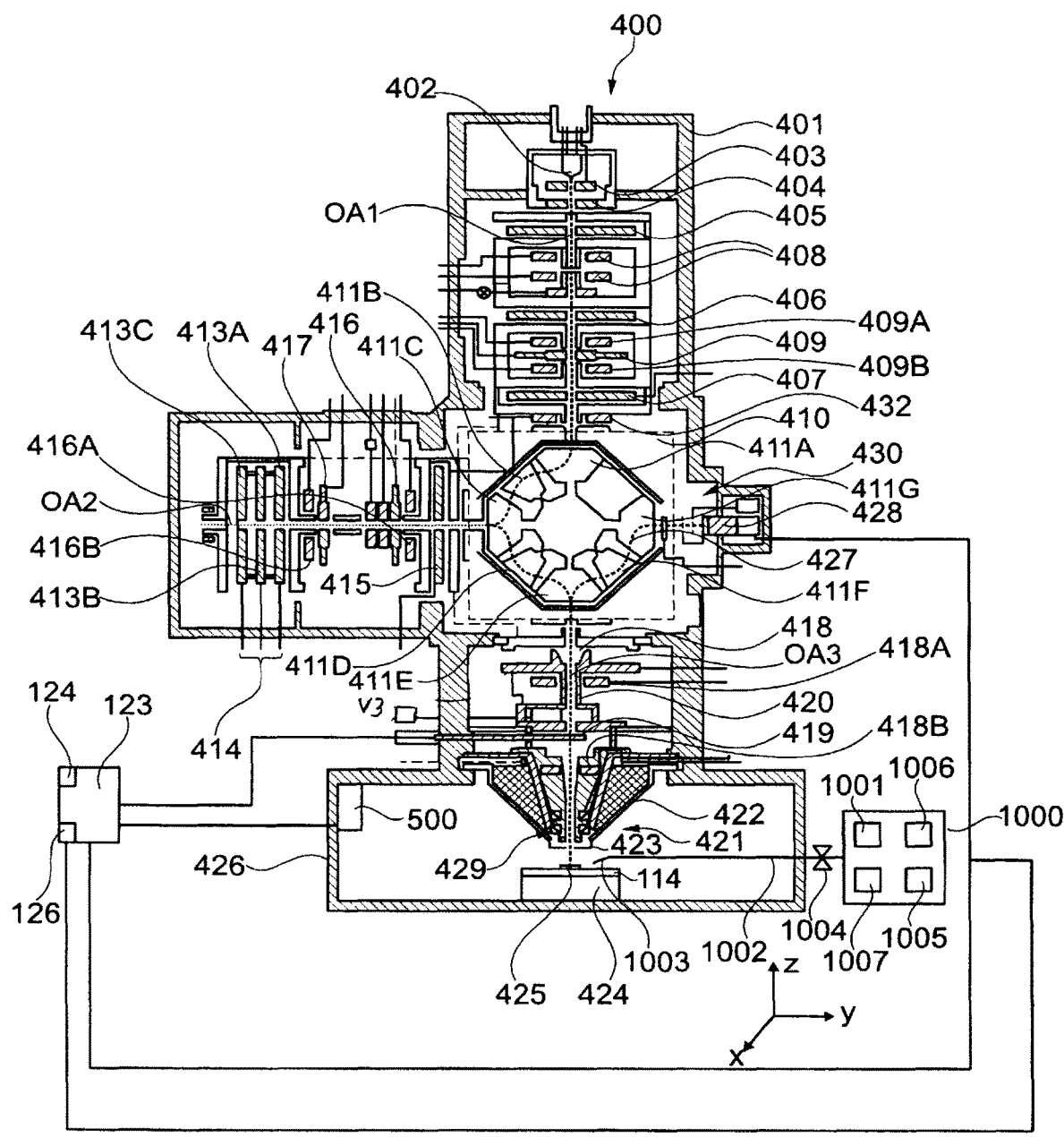
FIG. 3 shows a third embodiment of a particle beam apparatus.

FIG. 3 is a schematic illustration of a further embodiment of a particle beam apparatus according to the system described herein. This embodiment of the particle beam apparatus is provided with the reference sign 400 and may comprise a mirror corrector for correcting e.g. chromatic and/or spherical aberrations. The particle beam apparatus 400 may comprise a particle beam column 401, which may be embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector units.

The particle beam column 401 may comprise a particle beam generator in the form of an electron source 402 (cathode), an extraction electrode 403, and an anode 404. By way of example, the electron source 402 is embodied as a thermal field emitter. Electrons emerging from the electron source 402 may be accelerated to the anode 404 on account of a potential difference between the electron source 402 and the anode 404. Accordingly, a particle beam in the form of an electron beam may be formed along a first optical axis OA1.

The particle beam may be guided along a beam path, which corresponds to the first optical axis OA1, after the particle beam has emerged from the electron source 402. A first electrostatic lens 405, a second electrostatic lens 406, and a third electrostatic lens 407 may be used to guide the particle beam.

Furthermore, the particle beam may be set along the beam path using a beam guiding device. The beam guiding device of this embodiment may comprise a source setting unit with two magnetic deflection units 408 disposed along the first optical axis OA1. Moreover, the particle beam apparatus 400 may comprise electrostatic beam deflection units. A first electrostatic beam deflection unit 409, which also may be embodied as a quadrupole in a further embodiment, may be disposed between the second electrostatic lens 406 and the third electrostatic lens 407. The first electrostatic beam deflection unit 409 may be likewise disposed downstream of the magnetic deflection units 408. A first multi-pole unit 409A in the form of a first magnetic deflection unit may be disposed at one side of the first electrostatic beam deflection unit 409. Moreover, a second multi-pole unit 409B in the form of a second magnetic deflection unit may be disposed at the other side of the first electrostatic beam deflection unit 409. The first electrostatic beam deflection unit 409, the first multipole unit 409A, and the second multi-pole unit 409B may be set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 may be disposed at the entrance to the beam deflection device 410.

The beam deflection device 410 may be used as a particle beam deflector, which deflects the particle beam in a specific manner. The beam deflection device 410 may comprise a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and said particle beam may be deflected by the beam deflection device 410 in the direction of a second optical axis OA2. The beam deflection may be performed by means of the first magnetic sector 411A, by means of the second magnetic sector 411B and by means of the third magnetic sector 411C through an angle of 30° to 120°. The second optical axis OA2 may be oriented at the same angle with respect to the first optical axis OA1. The beam deflection device 410 also deflects the particle beam which may be guided along the second optical axis OA2, to be precise in the direction of a third optical axis OA3. The beam deflection may be provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 may be provided by deflection of the particle beam at an angle of 90°. Hence, the third optical axis OA3 extends coaxially with respect to the first optical axis OA1. However, reference is made to the fact that the particle beam apparatus 400 according to the system described herein described here is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam may be guided along the second optical axis OA2. The particle beam may be guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, they may be deflected to the third optical axis OA3 by the third magnetic sector 411C, the fourth magnetic sector 411D, and the fifth magnetic sector 411E.

The electrons of the particle beam emerge from the beam deflection device 410 and said electrons may be guided along the third optical axis OA3 to an object 425 that may be intended to be examined and may be disposed in an object holder 114. On the path to the object 425, the particle beam may be guided to a fifth electrostatic lens 418, a beam guiding tube 420, a fifth multi-pole unit 418A, a sixth multi-pole unit 418B, and an objective lens 421. The fifth electrostatic lens 418 may be an electrostatic immersion lens. By way of the fifth electrostatic lens 418, the particle beam may be decelerated or accelerated to an electric potential of the beam guiding tube 420.

By means of the objective lens 421, the particle beam may be focused into a focal plane in which the object 425 is disposed. The object holder 114 may be disposed at a movable sample stage 424. The movable sample stage 424 may be disposed in a sample chamber 426 of the particle beam apparatus 400. The sample stage 424 may be embodied to be movable in three directions disposed perpendicular to one another, namely in an x-direction (first stage axis), in a y-direction (second stage axis) and in a z-direction (third stage axis). Moreover, the sample stage 424 may be rotated about two rotation axes which may be disposed perpendicular to one another (stage rotation axes).

The sample chamber 426 may be under vacuum. For the purposes of generating the vacuum, a pump (not illustrated) may be disposed at the sample chamber 426. In the embodiment illustrated in FIG. 3, the sample chamber 426 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 426 may be vacuum-sealed.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam apparatus may be decelerated to a potential of the object 425. The objective lens 421 is not restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which may be focused onto the object 425 interacts with the object 425. Interaction particles may be generated. In particular, secondary electrons may be emitted from the object 425 or backscattered electrons may be backscattered at the object 425. The secondary electrons or the backscattered electrons may be accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 may comprise a first analysis detector 419, which may be disposed between the beam deflection device 410 and the objective lens 421 along the beam path. Secondary electrons traveling in directions oriented at a large angle with respect to the third optical axis OA3 may be detected by the first analysis detector 419. Backscattered electrons and secondary electrons which may have a small axial distance with respect to the third optical axis OA3 at the location of the first analysis detector 419—i.e. backscattered electrons and secondary electrons which may have a small distance from the third optical axis OA3 at the location of the first analysis detector 419—enter the beam deflection device 410 and may be deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which may be largely generated by emitted secondary electrons. The detection signals which are generated by the first analysis detector 419 may be passed to a control unit 123 and may be used to obtain information about the properties of the interaction region of the focused particle beam with the object 425. In particular, the focused particle beam may be scanned over the object 425 using a scanning device 429. By means of the detection signals generated by the first analysis detector 419, an image of the scanned region of the object 425 then may be generated and displayed on a display unit. The display unit is for example a monitor 124 that is disposed at the control unit 123. In the embodiment illustrated here, the monitor 124 is provided with an additional optical signaling device, for example a red LED, and/or with an additional acoustic signaling device, which may emit a warning sound.

The second analysis detector 428 also may be connected to the control unit 123. Detection signals of the second analysis detector 428 may be passed to the control unit 123 and used to generate an image of the scanned region of the object 425 and to display it on a display unit. The display unit is, for example, the monitor 124 that is disposed at the control unit 123.

Disposed at the sample chamber 426 may be a radiation detector 500, which may be used to detect interaction radiation, for example x-ray radiation and/or cathodoluminescence. The radiation detector 500 may be connected to the control unit 123, which may have the monitor 124. The control unit 123 processes detection signals of the radiation detector 500 and displays them in the form of images on the monitor 124.

The control unit 123 furthermore may have a database 126, in which data may be stored and from which data may be read out.

The particle beam apparatus 400 may comprise a gas feed device 1000, which serves to feed a gaseous precursor to a specific position on the surface of the object 425. The gas feed device 1000 may comprise a gas reservoir in the form of a precursor reservoir 1001. The precursor reservoir 1001 may have a certain initial fill. Expressed differently, the precursor reservoir 1001 contains a certain amount of precursor in the fully filled state. This may be the initial fill mass. By way of example, the precursor is received as a solid or liquid pure substance in the precursor reservoir 1001. In order to bring the precursor into the gaseous phase, the precursor may be evaporated or sublimated within the precursor reservoir 1001.

By way of example, phenanthrene is used as precursor. Essentially a layer of carbon or a carbon-containing layer then deposits on the surface of the object 425. As an alternative thereto, by way of example, a precursor comprising metal may be used to deposit a metal or a metal-containing layer on the surface of the object 425. However, the depositions are not limited to carbon and/or metals. Rather, arbitrary substances may be deposited on the surface of the object 425, for example semiconductors, non-conductors or other compounds. Furthermore, provision also may be made for the precursor to be used for ablating material of the object 425 upon interaction with a particle beam.

The gas feed device 1000 may be provided with a feed line 1002. The feed line 1002 may have, in the direction of the object 425, a hollow tube 1003, which may be able to be brought into the vicinity of the surface of the object 425 for example at a distance of 10 μm to 1 mm from the surface of the object 425. The hollow tube 1003 may have a feed opening, the diameter of which is, for example, in the range of 10 μm to 1000 μm, in particular in the range of 100 μm to 600 μm. The feed line 1002 may have a valve 1004 in order to regulate the flow rate of gaseous precursor into the feed line 1002. Expressed differently, when the valve 1004 is opened, gaseous precursor from the precursor reservoir 1001 may be introduced into the feed line 1002 and guided via the hollow tube 1003 to the surface of the object 425. When the valve 1004 is closed, the flow of the gaseous precursor onto the surface of the object 425 may be stopped.

The gas feed device 1000 may be furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 may be connected to the control unit 123 of the particle beam apparatus 400.

In further embodiments, the precursor reservoir 1001 is not disposed directly at the gas feed device 1000. Rather, in said further embodiments, provision is made for the precursor reservoir 1001 to be disposed for example at a wall of a space in which the particle beam apparatus 400 is situated.

The gas feed device 1000 may comprise a temperature measuring unit 1006. By way of example, an infrared measuring apparatus or a semiconductor temperature sensor is used as temperature measuring unit 1006. However, the system described herein is not restricted to the use of such temperature measuring units. Rather, any suitable temperature measuring unit which is suitable for the system described herein may be used as temperature measuring unit. In particular, provision may be made for the temperature measuring unit not to be disposed at the gas feed device 1000 itself, but rather to be disposed for example at a distance from the gas feed device 1000.

The gas feed device 1000 further may comprise a temperature setting unit 1007. By way of example, the temperature setting unit 1007 is a heating device, in particular a conventional infrared heating device. As an alternative thereto, the temperature setting unit 1007 is embodied as a heating and/or cooling device, which may comprise a heating wire, for example. However, the system described herein is not restricted to the use of such a temperature setting unit 1007. Rather, any suitable temperature setting unit may be used for the system described herein.

The control unit 123 of the particle beam apparatus 100, 200 or 400 may be embodied as a processor or may comprise a processor. A computer program product comprising a program code which, when executed, carries out a method for operating the gas feed device 1000 may be loaded into the processor.

Figure 4:
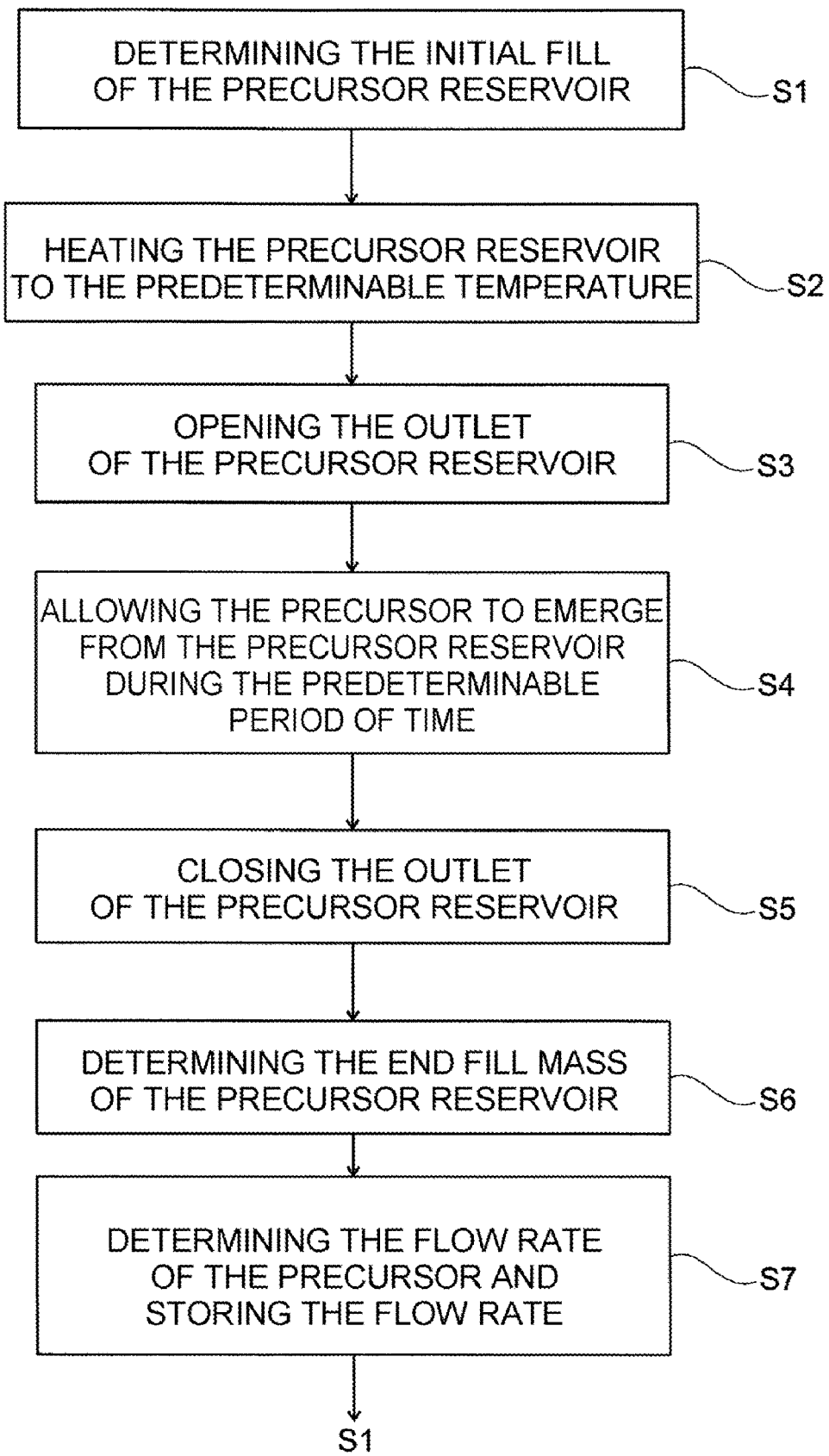
FIG. 4 shows a schematic illustration of a procedure of an embodiment of a method for operating a gas feed device.

Firstly, initial method steps of an embodiment of the method according to the system described herein, which are illustrated in FIG. 4, may be carried out at the factory, for example. In particular, provision may be made for these initial method steps not to be carried out by a user of the particle beam apparatus 100, 200 or 400. In the initial method steps, provision may be made for the flow rate of the precursor through the outlet in the form of the valve 1004 of the precursor reservoir 1001 to be determined depending on the temperature of the precursor reservoir 1001 and for said flow rate to be stored in the database 126 of the control unit 123.

The initial fill in the form of an initial fill amount (i.e., the initial fill mass) of the precursor reservoir 1001 may be determined in a method step S1. To this end, use may be made of a measuring device, for example a conventional set of industrial scales. Accordingly, the precursor reservoir 1001 may be weighed. Prior to the precursor reservoir 1001 being weighed, it may be removed from the gas feed device 1000 or not installed in the gas feed device 1000 in this embodiment of the method according to the system described herein. Consequently, only the precursor reservoir 1001 may be weighed in this embodiment. The system described herein is not limited to the use of a measuring device in the form of industrial scales. Rather, any suitable measuring device that renders determination of the initial fill in the form of the initial fill mass of the precursor reservoir 1001 possible may be used for the system described herein.

In a further method step S2, the precursor reservoir 1001 may be installed in the gas feed device 1000 and heated to a predeterminable temperature using the temperature setting unit 1007. By way of example, the temperature setting unit 1007 is a heating device, in particular a conventional infrared heating device or a heating wire, as already mentioned above. By way of example, the precursor reservoir 1001 is heated to a temperature between 20® C. and 100° C., more particularly between 30° C. and 90° C., wherein the aforementioned range limits are included in the range.

Once the precursor reservoir 1001 is heated to the predeterminable temperature, the outlet in the form of the valve 1004 of the precursor reservoir 1001 may be opened in method step S3 such that the precursor flows through the valve 1004 from the precursor reservoir 1001 into the feed line 1002.

Then, the precursor emerges from the precursor reservoir 1001 during a predeterminable period of time, which may be chosen freely, in a method step S4. By way of example, the predeterminable period of time lies between 30 minutes and 10 hours, for example 5 or 6 hours. Expressed differently, the precursor emerges from the precursor reservoir 1001 during the predeterminable period of time. However, the system described herein is not restricted to the use of the aforementioned periods of time. Rather, any suitable period of time may be used for the system described herein.

Then, the outlet in the form of the valve 1004 of the precursor reservoir 1001 may be closed in method step S5. This may be followed, in method step S6, by a removal of the precursor reservoir 1001 and a determination of an end fill amount (i.e., the end fill mass) of the precursor reservoir 1001 using the aforementioned measuring device. Expressed differently, the precursor reservoir 1001 may be weighed again in order to determine how much precursor may be still contained in the precursor reservoir 1001.

In a further method step S7, the flow rate of the precursor at the chosen predeterminable temperature then may be determined depending on the initial fill mass (i.e., the initial fill amount), the end fill mass (i.e., the end fill amount) and the chosen predeterminable period of time. By way of example, the flow rate F emerges as follows as a function of the predeterminable temperature T:

$$F(T) = \frac{\text{initial fill mass} - \text{end fill mass}}{\text{predeterminable period of time}}. \qquad [3]$$

Subsequently, the determined flow rate may be stored in the database 126 of the control unit 123 as a function of the chosen predeterminable temperature.

In this embodiment of the method according to the system described herein, provision may be made for method steps S1 to S7 to be carried out multiple times in such a way that a plurality of flow rates are determined for a plurality of different temperatures and for said flow rates to be stored in the database 126 as a function of the respective corresponding temperature. Expressed differently, in this embodiment of the method according to the system described herein, a first flow rate of the precursor through the outlet in the form of the valve 1004 of the precursor reservoir 1001 may be determined at a first predeterminable temperature and a second flow rate of the precursor through the outlet in the form of the valve 1004 of the precursor reservoir 1001 may be determined at a second predeterminable temperature. In particular, provision may be made in this embodiment of the method according to the system described herein for a multiplicity of flow rates to be ascertained depending on respectively different temperatures of the precursor reservoir 1001. The multiplicity contains, e.g., more than three flow rates, more than eight flow rates or more than ten flow rates depending on respectively different temperatures of the precursor reservoir 1001. By way of example, FIG. 5 shows 6 flow rates F ascertained with the aforementioned method steps S1 to S7. 50° C., 55° C., 60° C., 65° C., 70° C. and 75° C. were chosen as temperatures T.

Figure 5:
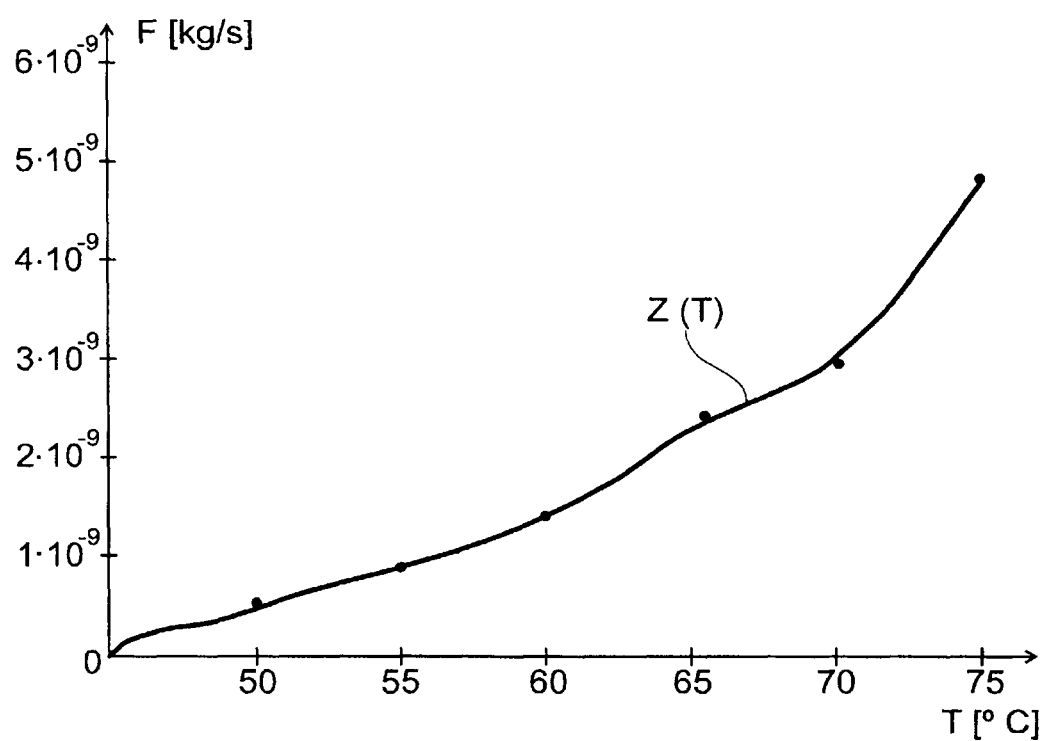
FIG. 5 shows a schematic illustration of flow rates of a precursor of a gas feed device as a function of the temperature of a precursor reservoir, according to an embodiment of the system described herein.

In the embodiment illustrated in FIG. 5, a functional relationship Z(T) is determined in respect of the determined flow rates F as a function of the selected predeterminable temperatures T. The functional relationship Z(T) may be a linear relationship or a nonlinear relationship. A step function may by all means also be comprised by the functional relationship Z(T) or forms the functional relationship Z(T). By way of example, the functional relationship Z(T) may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, provision may be made for the functional relationship Z(T) to be determined by an extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship Z(T) may be determined by forming an average, ascertaining random values and/or determining the smallest value or the largest value from the set of the first value and the second value.

The determined functional relationship Z(T), by means of which a flow rate F of the precursor is determinable as a function of the temperature T, may be likewise stored in the database 126 of the memory unit 123.

In a further embodiment of the method according to the system described herein, provision is made of carrying out method steps S1 to S7 and the determination of the functional relationship Z(T) for determining the flow rate(s) F for a plurality of precursors, which may be received in different precursor reservoirs 1001. Consequently, the functional relationships Z(T), by means of which a flow rate F of each precursor may be determinable as a function of the temperature T, may be stored in the data memory 126 for each precursor and for each precursor reservoir 1001 in this embodiment.

By way of example, method steps S1 to S7 may be carried out at the factory when manufacturing the particle beam apparatus 100, 200 or 400.

Figure 6:
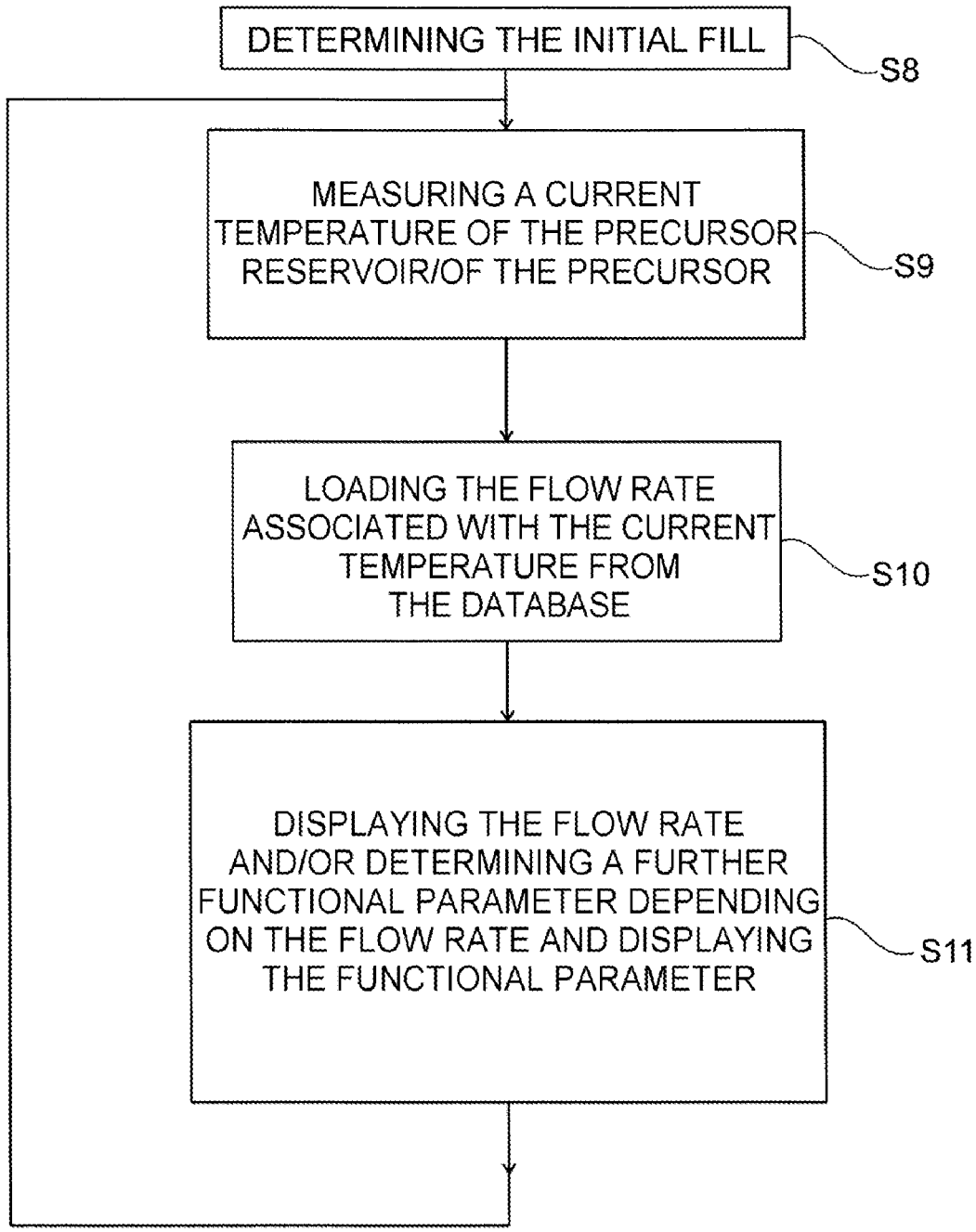
FIG. 6 shows a schematic illustration of a further procedure of the embodiment of the method for operating a gas feed device according to FIG. 4, according to an embodiment of the system described herein.

FIG. 6 shows further method steps of the embodiment of the method according to the system described herein. By way of example, these are carried out by a user of the particle beam apparatus 100, 200 or 400. The user-chosen precursor reservoir 1001 may have a certain initial fill. Expressed differently, the precursor reservoir 1001 contains a certain amount of precursor in the fully filled state, namely the initial fill amount (i.e., the initial fill mass). By way of example, the initial fill amount (i.e., the initial fill mass) may be determined in method step S8 by weighing the precursor reservoir 1001. To this end, the precursor reservoir 1001 may be removed from the gas feed device 1000 and reinstalled in the gas feed device 1000 following the weighing.

A current temperature T of the precursor reservoir 1001 may be measured using the temperature measuring unit 1006 in a method step S9. As an alternative thereto, a current temperature T of the precursor may be measured using the temperature measuring unit 1006. Further, a flow rate F of the precursor through the outlet in the form of the valve 1004 of the precursor reservoir 1001, associated with the current temperature T of the precursor reservoir 1001 or of the precursor, may be loaded from the database 126 into the control unit 123 in method step S10. More precisely, the associated flow rate F may be loaded into the processor of the control unit 123. By way of example, the functional relationship Z(T) may be used to determine the flow rate F. Then, the associated flow rate F may be displayed on a display unit, for example the monitor 124, in a further method step S11. In addition or as an alternative thereto, provision is made for at least one functional parameter of the precursor reservoir 1001 to be determined as a function of the flow rate F using the control unit 123 and then for the determined functional parameter to be displayed, e.g., on the display unit, for example the monitor 124.

By way of example, the functional parameter is the current fill amount of the precursor reservoir 1001 or the remaining time, during which the precursor emerges through the valve 1004 of the precursor reservoir 1001 until the initial fill of the precursor reservoir 1001 is completely used up.

The current fill amount (i.e., the current fill mass) of the precursor reservoir 1001 may be determined depending on the flow rate F, the initial fill amount (i.e., the initial fill mass) of the precursor reservoir 1001 and the time the valve 1004 of the precursor reservoir 1001 is open. The time the valve 1004 is open may be the time during which the precursor may flow to the object 125, 425 through the valve 1004 of the precursor reservoir 1001. No precursor flows to the object 125, 425 when the valve 1004 is closed. In particular, the current fill amount of the precursor reservoir 1001 may be determined, e.g., as follows:

$$m = M - (F(T_{current}) \cdot t_{open}) \qquad [1]$$

where m is the current fill in the form of a current fill mass (i.e., the current fill amount) of the precursor reservoir 1001, M is the initial fill in the form of an initial fill mass (i.e., the initial fill amount) of the precursor reservoir 1001, $F(T_{current})$ is the flow rate of the precursor through the outlet of the precursor reservoir 1001 at the current temperature of the precursor reservoir 1001, and $t_{open}$ is the time the valve 1004 of the precursor reservoir 1001 is open.

By way of example, the current fill amount is calculated in the processor of the control unit 123. The current fill amount of the precursor reservoir 1001 may be displayed on the display unit, for example the monitor 124.

The remaining time, during which the precursor passes through the valve 1004 of the precursor reservoir 1001 until the initial fill (i.e., the initial fill mass) of the precursor reservoir 1001 has been completely used up, may be determined depending on the current fill m and the flow rate F of the precursor and may be displayed on the display unit, for example the monitor 124. In particular, the remaining time may be determined as follows:

$$t_{remain} = \frac{m}{F(T_{current})} \quad [2]$$

where $t_{remain}$ is the remaining time, m is the current fill in the form of the current fill mass (i.e., the current fill amount), and $F(T_{current})$ is the flow rate of the precursor through the valve 1004 of the precursor reservoir 1001 at the current temperature of the precursor reservoir 1001.

If the remaining time and/or the current fill amount drop below a predeterminable value, an optical signal may be output by the optical signaling device and/or an acoustic signal may be output by the acoustic signaling device, for example.

This embodiment of the method according to the system described herein has the advantage that the flow rate F and/or a further functional parameter is/are ascertainable in such a way that the flow rate F and/or the further functional parameter may be specified as accurately as possible. By way of example, this ensures a smooth operation when processing the object 125, 425 with the precursor. In particular, this may ensure that a virtually empty precursor reservoir 1001 is replaced in good time such that a substantially continuous flow of the precursor to the object 125, 425 is possible.

Figure 7:
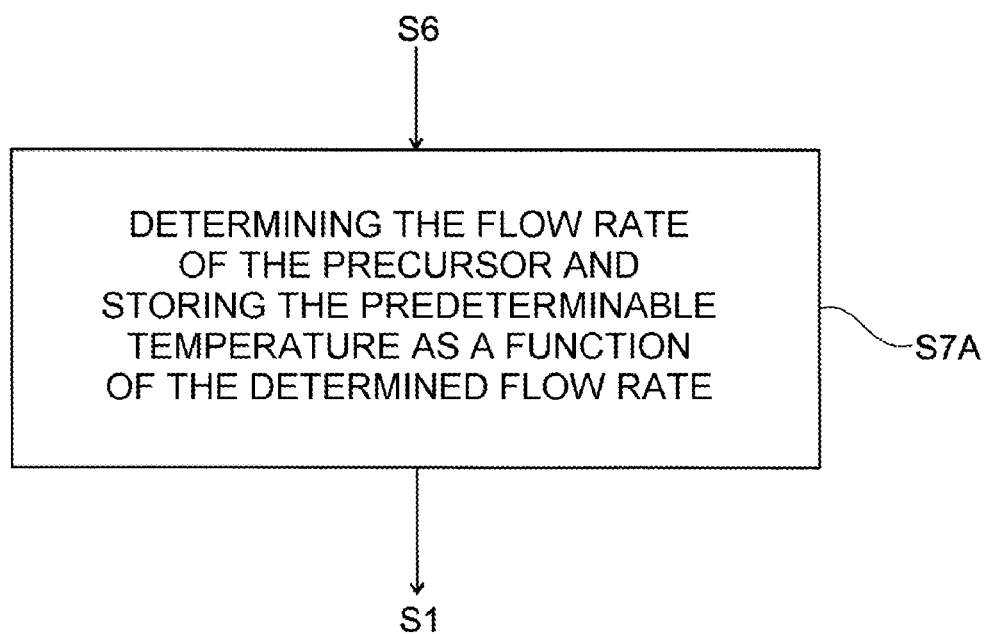
FIG. 7 shows a schematic illustration of a procedure of a further embodiment of a method for operating a gas feed device.

FIG. 7 shows initial method steps of a further embodiment of the method according to the system described herein. By way of example, these initial method steps are carried out at the factory. In particular, provision may be made for these initial method steps not to be carried out by a user of the particle beam apparatus 100, 200 or 400. The further embodiment of the method according to the system described herein is based on method steps S1 to S6 of the embodiment in FIG. 4, and so reference is initially made to the explanations provided further above in respect of this embodiment. In contrast to the embodiment according to FIG. 4, method step S7A is carried out after method step S6 in the embodiment according to FIG. 7. In method step S7A, the flow rate of the precursor at the chosen predeterminable temperature is determined depending on the initial fill mass (i.e., the initial fill amount), the end fill mass (i.e., the end fill amount) and the chosen predeterminable period of time. By way of example, the flow rate F emerges as follows as a function of the predeterminable temperature T:

$$F(T) = \frac{\text{initial fill mass} - \text{end fill mass}}{\text{predeterminable period of time}}. \quad [3]$$

Subsequently, the predeterminable temperature may be stored in the database 126 of the control unit 123 as a function of the determined flow rate.

In the embodiment of the method according to the system described herein according to FIG. 7, too, provision is made for method steps S1 to S6 and S7A to be carried out multiple times in such a way that a plurality of flow rates are determined for a plurality of different temperatures and for the different temperatures to be stored in the database 126 as a function of the respective determined flow rate. Expressed differently, in this embodiment of the method according to the system described herein, too, a first flow rate of the precursor through the outlet in the form of the valve 1004 of the precursor reservoir 1001 may be determined at a first predeterminable temperature and a second flow rate of the precursor through the outlet in the form of the valve 1004 of the precursor reservoir 1001 may be determined at a second predeterminable temperature. In particular, provision may be made in this embodiment of the method according to the system described herein for a multiplicity of flow rates to be ascertained depending on respectively different temperatures of the precursor reservoir 1001. The multiplicity contains, e.g., more than three flow rates, more than eight flow rates or more than ten flow rates depending on respectively different temperatures of the precursor reservoir 1001. Here, too, reference is made to FIG. 5 in illustrative fashion, said figure showing 6 flow rates F ascertained with the aforementioned method steps S1 to S6 and S7A and the associated temperatures thereof. 50° C., 55° C., 60° C., 65° C., 70° C. and 75° C. were chosen as temperatures T. As already mentioned above, a functional relationship Z(T) may be determined in the embodiment illustrated in FIG. 5 in respect of the determined flow rates F as a function of the selected predeterminable temperatures T. Reference is made to the explanations provided above, which also apply in this case. The determined functional relationship Z(T), by means of which a temperature T of the precursor reservoir 1001 is determinable as a function of the flow rate F of the precursor, may be likewise stored in the database 126 of the memory unit 123.

In a further embodiment of the method according to the system described herein according to FIG. 7, provision may be made of carrying out method steps S1 to S6 and S7A and the determination of the functional relationship Z(T) for determining the flow rate(s) F for a plurality of precursors, which may be received in different precursor reservoirs 1001. Consequently, the functional relationships Z(T), by means of which a temperature T of the precursor reservoir 1001 may be determinable as a function of the flow rate F of each precursor, may be stored in the data memory 126 for each precursor and for each precursor reservoir 1001 in this embodiment.

By way of example, method steps S1 to S6 and S7A may be carried out at the factory when manufacturing the particle beam apparatus 100, 200 or 400.

Figure 8:
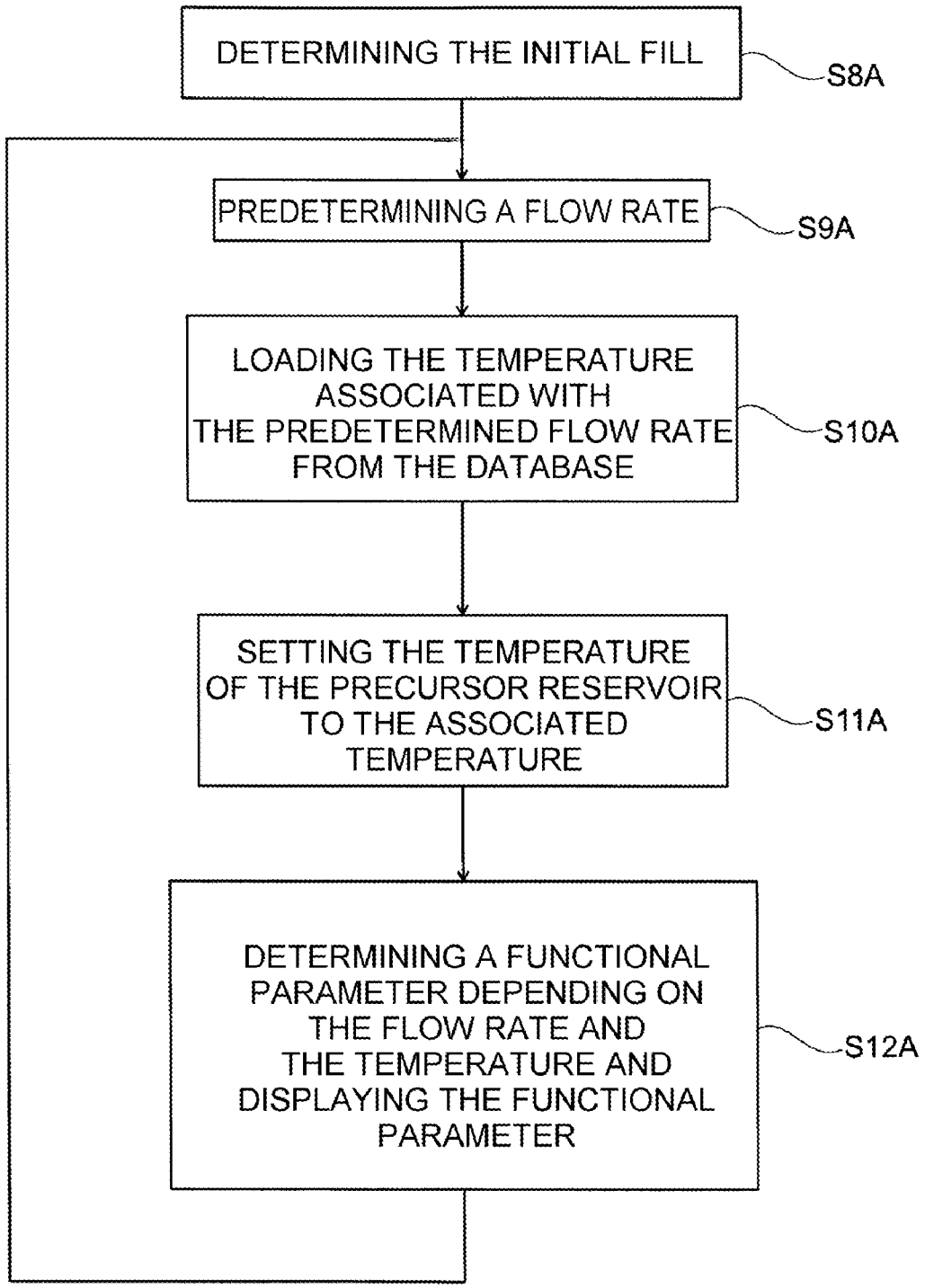
FIG. 8 shows a schematic illustration of a further procedure of the further embodiment of the method for operating a gas feed device according to FIG. 7, according to an embodiment of the system described herein.

FIG. 8 shows further method steps of the further embodiment of the method according to the system described herein. By way of example, these are carried out by a user of the particle beam apparatus 100, 200 or 400. The precursor reservoir 1001 chosen by the user may have a certain initial fill. Expressed differently, the precursor reservoir 1001 contains a certain amount of precursor in the fully filled state, namely the initial fill mass (i.e., the initial fill amount). By way of example, the initial fill mass (i.e., the initial fill amount) is determined in method step S8A by weighing the precursor reservoir 1001. To this end, the precursor reservoir 1001 may be removed from the gas feed device 1000 and reinstalled in the gas feed device 1000 following the weighing.

A desired flow rate F of the precursor through the outlet in the form of the valve 1004 of the precursor reservoir 1001 may be predetermined in a method step S9A. Further, in method step S10A there may be loading of a temperature T of the precursor reservoir 1001 from the database 126 into the control unit 123, said temperature being associated with the predetermined flow rate F. More precisely, the associated temperature T of the precursor reservoir 1001 may be loaded into the processor of the control unit 123. By way of example, the functional relationship Z(T) is used to determine the associated temperature T.

The temperature T of the precursor reservoir 1001 may be set to the associated temperature T in a method step S11A, for example by means of the temperature setting unit 1007, which may be embodied as a heating and/or cooling device.

In a further method step S12A, at least one functional parameter of the precursor reservoir 1001 may be determined depending on the flow rate F and the associated temperature using the control unit 123. The determined functional parameter then may be displayed on the display unit, for example the monitor 124.

By way of example, the functional parameter is the current fill amount (i.e., the current fill mass) of the precursor reservoir 1001 or the remaining time, during which the precursor emerges through the valve 1004 of the precursor reservoir 1001 until the initial fill of the precursor reservoir 1001 is completely used up.

The current fill amount (i.e., the fill mass) of the precursor reservoir 1001 may be determined depending on the flow rate F, the initial fill mass (i.e., the initial fill amount) of the precursor reservoir 1001 and the time the valve 1004 of the precursor reservoir 1001 is open. The time the valve 1004 is open may be the time during which the precursor may flow to the object 125, 425 through the valve 1004 of the precursor reservoir 1001. No precursor flows to the object 125, 425 when the valve 1004 is closed. In particular, the current fill of the precursor reservoir 1001 may be determined, e.g., as follows:

$$m = M - (F(T_{current}) \cdot t_{open}) \quad [1]$$

where m is the current fill in the form of a current fill mass (i.e., the current fill amount) of the precursor reservoir 1001, M is the initial fill in the form of an initial fill mass (i.e., the initial fill amount) of the precursor reservoir 1001, $F(T_{current})$ is the flow rate of the precursor through the outlet of the precursor reservoir 1001 at the associated and set temperature of the precursor reservoir 1001, and $t_{open}$ is the time the valve 1004 of the precursor reservoir 1001 is open.

By way of example, the current fill amount (i.e., the current fill mass) is calculated in the processor of the control unit 123. The current fill amount (i.e., the current fill mass) of the precursor reservoir 1001 may be displayed on the display unit, for example the monitor 124.

The remaining time, during which the precursor passes through the valve 1004 of the precursor reservoir 1001 until the initial fill (i.e., the initial fill mass—expressed differently: the initial fill amount) of the precursor reservoir 1001 has been completely used up, may be determined depending on the current fill m and the flow rate F of the precursor and may be displayed on the display unit, for example the monitor 124. In particular, the remaining time may be determined as follows:

$$t_{remain} = \frac{m}{F(T_{current})} \quad [2]$$

where $t_{remain}$ is the remaining time, m is the current fill in the form of the current fill mass (i.e., the current fill amount), and $F(T_{current})$ is the flow rate of the precursor through the valve 1004 of the precursor reservoir 1001 at the associated and set temperature of the precursor reservoir 1001.

This embodiment of the method according to the system described herein also may have the advantage that a functional parameter is ascertainable in such a way that the functional parameter may be specified as accurately as possible. By way of example, this ensures a smooth operation when processing the object 125, 425 with the precursor. In particular, this may ensure that a virtually empty precursor reservoir 1001 is replaced in good time such that a substantially continuous flow of the precursor to the object 125, 425 is possible.

The features of the system described herein disclosed in the present description, in the drawings and in the claims may be essential for the realization of the invention in the various embodiments thereof, both individually and in arbitrary combinations. The invention is not restricted to the described embodiments. It may be varied within the scope of the claims and taking into account the knowledge of the relevant person skilled in the art. Other embodiments of the invention will be apparent to those skilled in the art from a consideration of the specification and/or an attempt to put into practice the invention disclosed herein. It is intended that the specification and examples be considered as illustrative examples only, with the true scope and spirit of the invention being indicated by the following claims.

The invention claimed is:

1. A method for operating a gas feed device for a particle beam apparatus, the method comprising:
   loading a flow rate of a precursor through an outlet of a precursor reservoir from a database into a control unit, the flow rate being associated with a current temperature of the precursor reservoir; and
   determining at least one functional parameter of the precursor reservoir depending on the flow rate using the control unit and informing a user of the gas feed device about the determined functional parameter, wherein the functional parameter is a current fill amount of the precursor reservoir or a remaining time during which the precursor emerges through the outlet of the precursor reservoir until an initial fill of the precursor reservoir is completely used up, wherein the flow rate of the precursor through the outlet of the precursor reservoir is determined and stored in the database for loading from the database into the control unit, wherein the flow rate of the precursor is determined at a predeterminable temperature depending on an initial fill amount of the precursor reservoir, an end fill amount of the precursor reservoir and a predeterminable period of time during which the precursor emerges from the precursor reservoir.

2. The method as claimed in claim 1, wherein the temperature of the precursor reservoir is loaded from the database into the control unit.

3. The method as claimed in claim 1, wherein informing the user of the gas feed device about the determined functional parameter comprises at least one of the following:
   (i) displaying the determined functional parameter on a display unit;
   (ii) outputting an optical signal by means of an optical signaling device; and
   (iii) outputting an acoustic signal by means of an acoustic signaling device.

4. The method as claimed in claim 1, wherein the current fill amount of the precursor reservoir is determined depending on the flow rate and an initial fill amount of the precursor reservoir.

5. The method as claimed in claim 4, wherein the functional parameter in the form of the current fill amount of the precursor reservoir is displayed on a display unit.

6. The method as claimed in claim 1, wherein the remaining time is determined depending on the current fill amount and the flow rate and displayed.

7. The method as claimed in claim 1, wherein the flow rate of the precursor through the outlet of the precursor reservoir is determined using a measuring device and using a temperature setting unit.

8. The method as claimed in claim 7, wherein the method comprises at least one of the following:
(viii) inserting the precursor reservoir into the gas feed device;
(ix) removing the precursor reservoir from the gas feed device;
(x) storing the determined flow rate in the database as a function of the predeterminable temperature; and
(xi) storing the predeterminable temperature in the database as a function of the determined flow rate.

9. The method as claimed in claim 7, wherein the method steps are carried out at a first predeterminable temperature for determining a first flow rate of the precursor through the outlet of the precursor reservoir and carried out at a second predeterminable temperature for determining a second flow rate of the precursor through the outlet of the precursor reservoir, and
wherein the method further comprises determining a functional relationship in respect of the first flow rate and the second flow rate depending on the first predeterminable temperature and the second predeterminable temperature.

10. A method for operating a gas feed device for a particle beam apparatus, the method comprising:
loading a flow rate of a precursor through an outlet of a precursor reservoir from a database into a control unit, the flow rate being associated with a current temperature of the precursor; and
determining at least one functional parameter of the precursor reservoir depending on the flow rate using the control unit and informing a user of the gas feed device about the determined functional parameter, wherein the functional parameter is a current fill amount of the precursor reservoir or a remaining time during which the precursor emerges through the outlet of the precursor reservoir until an initial fill of the precursor reservoir is completely used up, wherein the flow rate of the precursor through the outlet of the precursor reservoir is determined and stored in the database for loading from the database into the control unit, wherein the flow rate of the precursor is determined at a predeterminable temperature depending on an initial fill amount of the precursor reservoir, an end fill amount of the precursor reservoir and a predeterminable period of time during which the precursor emerges from the precursor reservoir.

11. A non-transitory computer readable medium containing executable program code which, when executed by a processor, performs a method of controlling a gas feed device including:
loading a flow rate of a precursor through an outlet of a precursor reservoir from a database into a control unit, the flow rate being associated with a current temperature of the precursor; and
determining at least one functional parameter of the precursor reservoir depending on the flow rate using the control unit and informing a user of the gas feed device about the determined functional parameter, wherein the functional parameter is a current fill amount of the precursor reservoir or a remaining time during which the precursor emerges through the outlet of the precursor reservoir until an initial fill of the precursor reservoir is completely used up, wherein the flow rate of the precursor through the outlet of the precursor reservoir is determined and stored in the database for loading from the database into the control unit, wherein the flow rate of the precursor is determined at a predeterminable temperature depending on an initial fill amount of the precursor reservoir, an end fill amount of the precursor reservoir and a predeterminable period of time during which the precursor emerges from the precursor reservoir.

12. A gas feed device comprising:
at least one precursor reservoir, which includes at least one precursor and at least one outlet for the precursor for the purposes of feeding the precursor onto an object;
at least one temperature measuring unit for measuring a current temperature of the precursor reservoir and/or at least one temperature setting unit for setting the temperature of the precursor reservoir and/or the temperature of the precursor;
at least one database for storing flow rates of the precursor through the outlet of the precursor reservoir and/or for storing temperatures of the precursor reservoir; and
at least one control unit with a processor, onto which a computer program product is loaded, the computer program product having program code that can be loaded into the processor and which, when executed, performs a method of controlling a gas feed device including:
loading at least one of the flow rates of the precursor through the outlet of the precursor reservoir from the database into the control unit, the at least one of the flow rates being associated with the current temperature of the precursor reservoir, and
determining at least one functional parameter of the precursor reservoir depending on the at least one of the flow rates using the control unit and informing a user of the gas feed device about the determined functional parameter, wherein the functional parameter is a current fill amount of the precursor reservoir or a remaining time during which the precursor emerges through the outlet of the precursor reservoir until an initial fill of the precursor reservoir is completely used up.

13. A particle beam apparatus for analyzing, observing and/or processing an object, comprising:
at least one beam generator for generating a particle beam with charged particles;
at least one objective lens for focusing the particle beam onto the object;
at least one detector for detecting interaction particles and/or interaction radiation, which result from an interaction of the particle beam with the object; and
at least one gas feed device comprising:
at least one precursor reservoir, which comprises at least one precursor and at least one outlet for the precursor for the purposes of feeding the precursor onto the object,
at least one temperature measuring unit for measuring a current temperature of the precursor reservoir and/or at least one temperature setting unit for setting the temperature of the precursor reservoir and/or the temperature of the precursor, at least one database for storing flow rates of the precursor through the outlet of the precursor reservoir and/or for storing temperatures of the precursor reservoir, and at least one control unit with a processor, onto which a computer program product is loaded, the computer program product having program code that can be loaded into the processor and which, when executed, performs a method of controlling a gas feed device including:

loading at least one of the flow rates of the precursor through the outlet of the precursor reservoir from the database into the control unit, the at least one of the flow rates being associated with the current temperature of the precursor reservoir; and determining at least one functional parameter of the precursor reservoir depending on the at least one of the flow rates using the control unit and informing a user of the gas feed device about the determined functional parameter, wherein the functional parameter is a current fill amount of the precursor reservoir or a remaining time during which the precursor emerges through the outlet of the precursor reservoir until an initial fill of the precursor reservoir is completely used up.

14. The particle beam apparatus as claimed in claim 13, wherein the beam generator is embodied as a first beam generator and the particle beam is embodied as a first particle beam with first charged particles, wherein the objective lens is embodied as a first objective lens for focusing the first particle beam onto the object, and wherein the particle beam apparatus furthermore comprises:

at least one second beam generator for generating a second particle beam with second charged particles; and at least one second objective lens for focusing the second particle beam onto the object.

15. The particle beam apparatus as claimed in claim 13, wherein the particle beam apparatus is an electron beam apparatus and/or an ion beam apparatus.

* * * * *